(12) United States Patent
Choi et al.

(10) Patent No.: US 12,243,483 B2
(45) Date of Patent: Mar. 4, 2025

(54) DISPLAY DEVICE

(71) Applicant: Samsung Display Co., LTD., Yongin-si (KR)

(72) Inventors: Yoon Sun Choi, Yongin-si (KR); Won Suk Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/426,037

(22) Filed: Jan. 29, 2024

(65) Prior Publication Data
US 2024/0420633 A1    Dec. 19, 2024

(30) Foreign Application Priority Data

Jun. 19, 2023    (KR) .................. 10-2023-0078117

(51) Int. Cl.
| | | |
|---|---|---|
| *G09G 3/3233* | (2016.01) | |
| *G09G 3/3275* | (2016.01) | |
| *H10K 59/123* | (2023.01) | |
| *H10K 59/126* | (2023.01) | |
| *H10K 59/131* | (2023.01) | |

(52) U.S. Cl.
CPC ......... *G09G 3/3233* (2013.01); *G09G 3/3275* (2013.01); *H10K 59/123* (2023.02); *H10K 59/126* (2023.02); *H10K 59/131* (2023.02); *G09G 2300/0426* (2013.01); *G09G 2310/0272* (2013.01); *G09G 2330/021* (2013.01)

(58) Field of Classification Search
None
See application file for complete search history.

(56) References Cited

U.S. PATENT DOCUMENTS

| | | | |
|---|---|---|---|
| 2020/0111988 A1* | 4/2020 | Lee | ............. H10K 50/84 |
| 2023/0060062 A1 | 2/2023 | Cho et al. | |
| 2024/0119889 A1* | 4/2024 | Choi | ............. G09G 3/32 |
| 2024/0119898 A1* | 4/2024 | Choi | ............. G09G 3/3275 |

FOREIGN PATENT DOCUMENTS

| | | |
|---|---|---|
| KR | 10-2021-0105462 A | 8/2021 |
| KR | 10-2021-0148547 A | 12/2021 |
| KR | 10-2023-0010109 A | 1/2023 |

\* cited by examiner

*Primary Examiner* — Amare Mengistu
*Assistant Examiner* — Sarvesh J Nadkarni
(74) *Attorney, Agent, or Firm* — Womble Bond Dickinson (US) LLP

(57) ABSTRACT

A display device includes an element layer including light emitting elements positioned in the emission areas; and a circuit layer including: light emitting pixel drivers; data lines electrically connected to the light emitting pixel drivers; first auxiliary lines extending in a first direction crossing the data lines; and second auxiliary lines extending in a second direction crossing the first direction, wherein the first auxiliary lines include a first bypass auxiliary line, wherein the second auxiliary lines include a second bypass auxiliary line, wherein the circuit layer further includes: a first connection auxiliary electrode spaced apart from the first bypass auxiliary line; a first connection line connecting the first bypass auxiliary line to the first connection auxiliary electrode; and a first auxiliary protrusion electrode protruding from the second bypass auxiliary line, and electrically connected to the first connection auxiliary electrode through an auxiliary connection hole.

20 Claims, 21 Drawing Sheets

FIG. 1
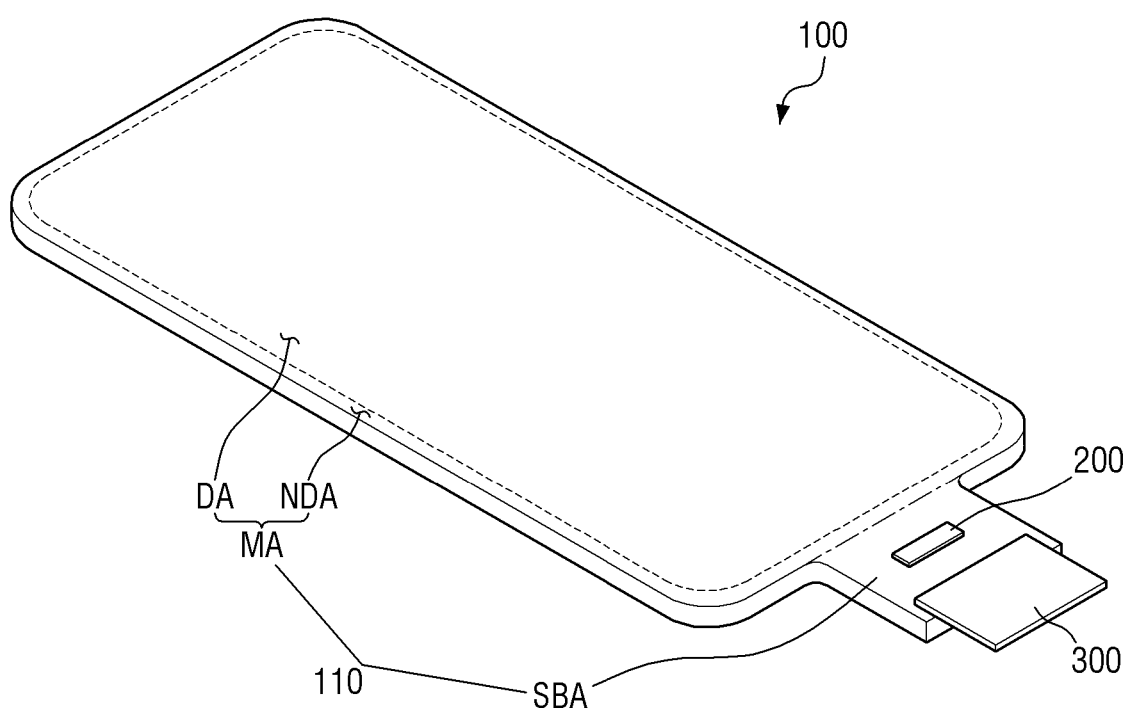
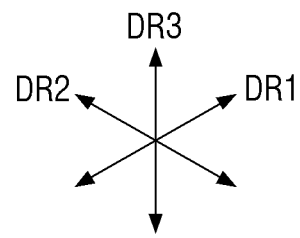

FIG. 4
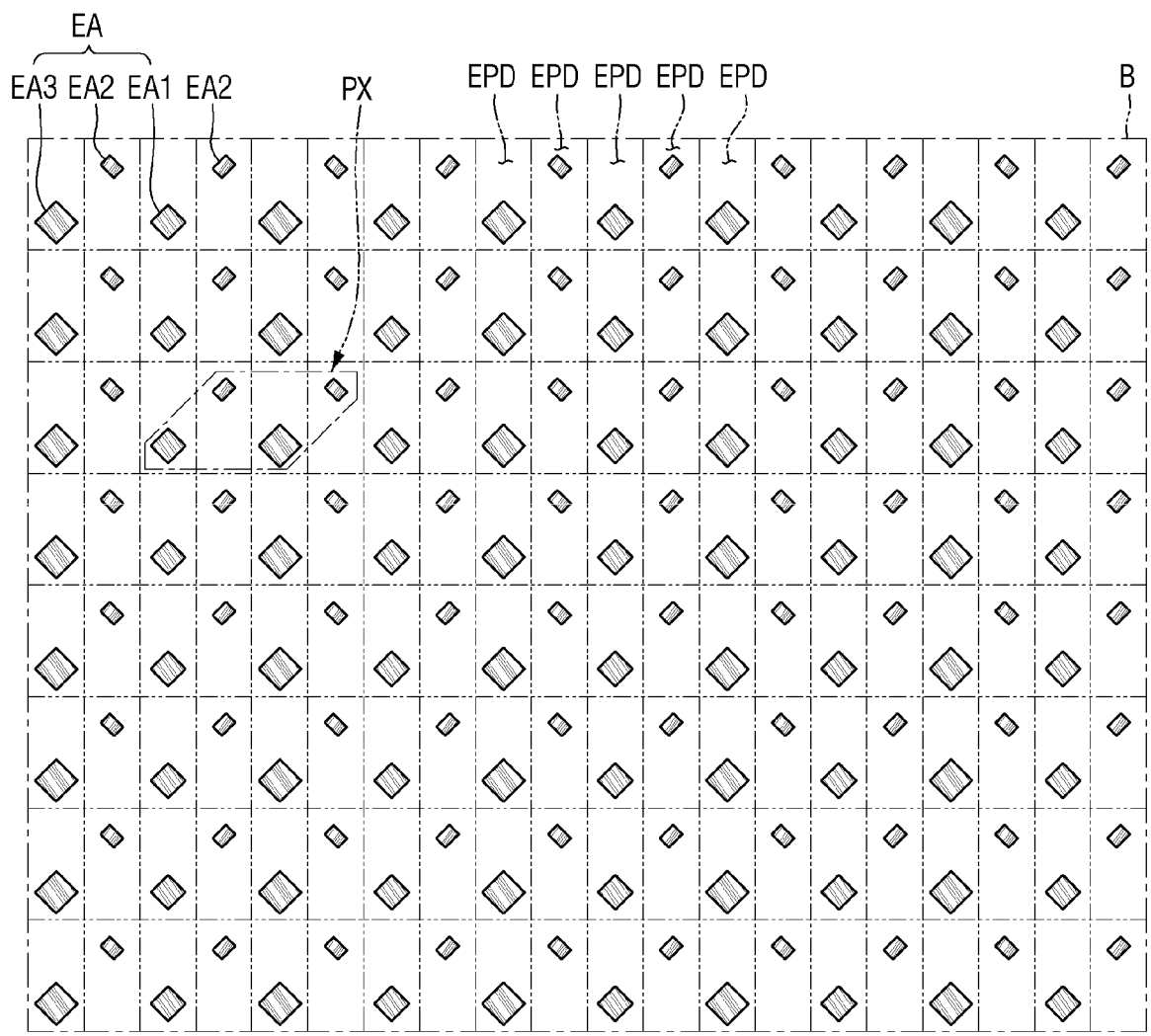
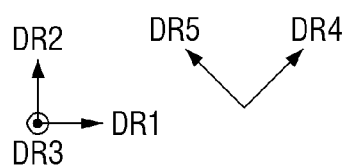

ASCE: ASCE1, ASCE2, ASCE3
ASPE: ASPE1, ASPE2, ASPE3

ASCE: ASCE1, ASCE2, ASCE3
ASPE: ASPE1, ASPE2, ASPE3

DISPLAY DEVICE

CROSS-REFERENCE TO RELATED APPLICATION

The present application claims priority to and the benefit of Korean Patent Application No. 10-2023-0078117, filed on Jun. 19, 2023, in the Korean Intellectual Property Office, the entire disclosure of which is incorporated herein by reference.

BACKGROUND

1. Field

Aspects of the present disclosure relate to display devices.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions.

Display devices may be flat panel display devices such as liquid crystal display devices, field emission display devices, and light emitting display devices. Examples of light emitting display devices may include organic light emitting display devices including organic light emitting elements, inorganic light emitting display devices including inorganic light emitting elements such as inorganic semiconductors, and micro light emitting display devices including micro light emitting elements.

The organic light emitting display device displays an image using light emitting elements, each including a light emitting layer made of an organic light emitting material. As described above, the organic light emitting display device is capable of displaying images using self-light emitting elements, and thus may have relatively superior performance in terms of power consumption, response speed, luminous efficiency, luminance, and wide viewing angle, as compared to other display devices.

One surface of the display device may be a display surface including a display area in which an image is displayed and a non-display area that is a periphery of the display area. Emission areas emitting light with various luminances and colors may be arranged in the display area.

The above information disclosed in this Background section is only for enhancement of understanding of the background of the invention and therefore it may contain information that does not form the prior art.

SUMMARY

Aspects of embodiments of the present disclosure are directed to a display device including data supply lines disposed in the non-display area and electrically connecting the data lines to a display driving circuit.

As the number of the data lines increases due to the desire for high resolution, the number of the data supply lines disposed in the non-display area also increases, which places a limit on reducing the width of the non-display area.

Aspects of the present disclosure provide a display device capable of reducing the width of a non-display area.

According to some embodiments of the present disclosure, there is provided a display device including: a substrate including a display area in which emission areas are arranged, and a non-display area located around the display area; a circuit layer on the substrate; and an element layer on the circuit layer, and including light emitting elements positioned in the emission areas, wherein the circuit layer includes: light emitting pixel drivers electrically connected to the light emitting elements; data lines electrically connected to the light emitting pixel drivers; first auxiliary lines extending in a first direction crossing the data lines and positioned in the light emitting pixel drivers; and second auxiliary lines extending in a second direction crossing the first direction and in parallel with the data lines, the second auxiliary lines being paired with respective ones of the data lines, wherein the first auxiliary lines include a first bypass auxiliary line electrically connected to a first data line of the data lines that is adjacent to the non-display area in the first direction, wherein the second auxiliary lines include a second bypass auxiliary line paired with a second data line spaced farther from the non-display area than the first data line in the first direction among the data lines, wherein the circuit layer further includes: a first connection auxiliary electrode adjacent to a crossing between the first bypass auxiliary line and the second bypass auxiliary line, and spaced apart from the first bypass auxiliary line; a first connection line connecting the first bypass auxiliary line to the first connection auxiliary electrode; and a first auxiliary protrusion electrode protruding from the second bypass auxiliary line, and electrically connected to the first connection auxiliary electrode through an auxiliary connection hole of auxiliary connection holes.

In some embodiments, the circuit layer further includes: data connection electrodes adjacent to crossings between the data lines and the first auxiliary lines, and spaced apart from the first auxiliary lines; and data protrusion electrodes protruding from the data lines and electrically connected to the data connection electrodes through data connection holes.

In some embodiments, the circuit layer further includes a second connection line connecting one of the data connection electrodes that is adjacent to a crossing between the first data line and the first bypass auxiliary line to the first bypass auxiliary line.

In some embodiments, the circuit layer further includes: a first power supply line and a second power supply line in the non-display area, and respectively transmitting a first power and a second power for driving the light emitting elements; and first power lines electrically connected between the light emitting pixel drivers and the first power supply line, wherein the first auxiliary lines further include second power auxiliary horizontal lines electrically connected to the second power supply line, and wherein the second auxiliary lines further include second power auxiliary vertical lines electrically connected to the second power auxiliary horizontal lines and the second power supply line.

In some embodiments, the circuit layer further includes: second connection auxiliary electrodes adjacent to crossings between the second power auxiliary vertical lines and the second power auxiliary horizontal lines; and second auxiliary protruding electrodes protruding from the second power auxiliary vertical lines and electrically connected to the second connection auxiliary electrodes through the auxiliary connection holes.

In some embodiments, one of the second power auxiliary horizontal lines is electrically connected to at least one of the second power auxiliary vertical lines, and the circuit layer further includes at least one third connection line connecting at least one of the second connection auxiliary electrodes that is adjacent to a crossing between the one of the second power auxiliary horizontal lines and the at least one of the second power auxiliary vertical lines to the one of the second power auxiliary horizontal lines.

In some embodiments, the circuit layer further includes: third connection auxiliary electrodes adjacent to crossings between the second power auxiliary vertical lines and the first bypass auxiliary line; third auxiliary protrusion electrodes protruding from the second power auxiliary vertical lines, and electrically connected to the third connection auxiliary electrodes through the auxiliary connection holes; fourth connection auxiliary electrodes adjacent to crossings between the second bypass auxiliary line and the second power auxiliary horizontal lines; and fourth auxiliary protrusion electrodes protruding from the second bypass auxiliary line, and electrically connected to the fourth connection auxiliary electrodes through the auxiliary connection holes.

In some embodiments, the display device further includes a display driving circuit configured to transmit data signals of the light emitting pixel drivers to the data lines, wherein the circuit layer further includes data supply lines in the non-display area, and electrically connected between the data lines and the display driving circuit, wherein a bypass area on one side of the display area includes a central bypass middle area, a first bypass side area parallel to the central bypass middle area in the first direction and in contact with the non-display area, and a second bypass side area between the central bypass middle area and the first bypass side area, wherein the first data line is in the first bypass side area, wherein the second data line is in the second bypass side area, wherein a first data supply line of the data supply lines that transmits a data signal of the first data line is electrically connected to the first data line through the first bypass auxiliary line and the second bypass auxiliary line, and wherein a second data supply line of the data supply lines that transmits a data signal of the second data line is directly electrically connected to the second data line.

In some embodiments, one of the light emitting elements is electrically connected between one of the light emitting pixel drivers and the second power supply line, and the one of the light emitting pixel drivers includes: a first transistor configured to generate a driving current for driving the one of the light emitting elements; a second transistor electrically connected between one of the data lines and a first electrode of the first transistor; a third transistor electrically connected between a gate electrode of the first transistor and a second electrode of the first transistor; a fourth transistor electrically connected between the gate electrode of the first transistor and a first initialization power line configured to transmit a first initialization power; a fifth transistor electrically connected between the first power lines and the first electrode of the first transistor; a sixth transistor electrically connected between the second electrode of the first transistor and the one of the light emitting elements; a seventh transistor electrically connected between the one of the light emitting elements and a second initialization power line configured to transmit a second initialization power; and an eighth transistor electrically connected between the first electrode of the first transistor and a bias power line configured to transmit a bias power.

In some embodiments, the circuit layer includes: a buffer layer covering a light blocking layer on the substrate; a first semiconductor layer on the buffer layer; a first gate insulating layer covering the first semiconductor layer; a first gate conductive layer on the first gate insulating layer; a second gate insulating layer covering the first gate conductive layer; a second gate conductive layer on the second gate insulating layer; a first interlayer insulating layer covering the second gate conductive layer; a second semiconductor layer on the first interlayer insulating layer; a third gate insulating layer covering the second semiconductor layer; a third gate conductive layer on the third gate insulating layer; a second interlayer insulating layer covering the third gate conductive layer; a first source-drain conductive layer on the second interlayer insulating layer; a first planarization layer covering the first source-drain conductive layer; a second source-drain conductive layer on the first planarization layer; and a second planarization layer covering the second source-drain conductive layer, wherein a channel portion, a source portion, and a drain portion of each of the first transistor, the second transistor, the fifth transistor, the sixth transistor, the seventh transistor, and the eighth transistor are on the first semiconductor layer, and wherein a channel portion, a source portion, and a drain portion of each of the third transistor and the fourth transistor are as a part of the second semiconductor layer.

In some embodiments, a gate electrode of the fourth transistor is electrically connected to a scan initialization line configured to transmit a scan initialization signal, wherein the first initialization power line is spaced apart from the scan initialization line and as another part of the second semiconductor layer, wherein the scan initialization line is on the third gate conductive layer, wherein the first auxiliary lines, the connection auxiliary electrodes, and the data connection electrodes are on the first source-drain conductive layer, wherein the data lines, the second auxiliary lines, the auxiliary protrusion electrodes, the data protrusion electrodes, and the first power lines are on the second source-drain conductive layer, wherein each of the auxiliary connection holes and the data connection holes penetrates the first planarization layer, and wherein the first auxiliary lines and the connection auxiliary electrodes overlap the first initialization power line and are spaced apart from the scan initialization line.

According to some embodiments of the present disclosure, there is provided a display device including: a substrate including a display area in which emission areas are arranged, and a non-display area around the display area; a circuit layer on the substrate; and an element layer on the circuit layer, and including light emitting elements positioned in the emission areas, wherein the circuit layer includes: light emitting pixel drivers electrically connected to the light emitting elements; data lines electrically connected to the light emitting pixel drivers; first auxiliary lines extending in a first direction crossing the data lines and positioned in the light emitting pixel drivers; second auxiliary lines extending in a second direction crossing the first direction and in parallel with the data lines, the second auxiliary lines being paired with respective ones of the data lines; connection auxiliary electrodes adjacent to crossings between the first auxiliary lines and the second auxiliary lines and spaced apart from the first auxiliary lines; and auxiliary protrusion electrodes protruding from the second auxiliary lines, and electrically connected to the connection auxiliary electrodes through an auxiliary connection hole of auxiliary connection holes.

In some embodiments, the circuit layer further includes: data connection electrodes adjacent to crossings between the data lines and the first auxiliary lines, and spaced apart from the first auxiliary lines and the connection auxiliary electrodes; and data protrusion electrodes protruding from the data lines and respectively electrically connected to the data connection electrodes through data connection holes.

In some embodiments, the connection auxiliary electrodes face one side of the first auxiliary lines in the second direction, the data connection electrodes face an other side of the first auxiliary lines in the second direction, and the connection auxiliary electrodes and the data connection electrodes are spaced apart from each other in a diagonal direction crossing the first direction and the second direction.

1 In some embodiments, the display device further includes a display driving circuit configured to transmit data signals of the light emitting pixel drivers to the data lines, wherein the circuit layer further includes data supply lines in the non-display area, and electrically connected between the data lines and the display driving circuit, wherein a bypass area on one side of the display area includes a central bypass middle area, a first bypass side area parallel to the central bypass middle area in the first direction and in contact with the non-display area, and a second bypass side area between the central bypass middle area and the first bypass side area, wherein the data lines include a first data line in the first bypass side area and a second data line in the second bypass side area, wherein the first auxiliary lines include a first bypass auxiliary line electrically connected to the first data line, wherein the second auxiliary lines include a second bypass auxiliary line paired with the second data line and electrically connected to the first bypass auxiliary line, wherein a first data supply line of the data supply lines that transmits a data signal of the first data line is electrically connected to the first data line through the first bypass auxiliary line and the second bypass auxiliary line, and wherein a second data supply line of the data supply lines that transmits a data signal of the second data line is directly electrically connected to the second data line.

In some embodiments, the circuit layer further includes: a first connection line connecting a first connection auxiliary electrode of the connection auxiliary electrodes that is adjacent to a crossing between the first bypass auxiliary line and the second bypass auxiliary line to the first bypass auxiliary line; and a second connection line connecting one of the data connection electrodes that is adjacent to a crossing between the first bypass auxiliary line and the first data line to the first bypass auxiliary line, wherein the second bypass auxiliary line is electrically connected to the first bypass auxiliary line through one of the auxiliary protrusion electrodes that overlaps the one of the connection auxiliary electrodes, the one of the connection auxiliary electrodes, and the first connection line, and wherein the first data line is electrically connected to the first bypass auxiliary line through one of the data protrusion electrodes that overlaps the one of the data connection electrodes, the one of the data connection electrodes, and the second connection line.

In some embodiments, the circuit layer further includes: a first power supply line and a second power supply line in the non-display area, and respectively transmitting a first power and a second power for driving the light emitting elements; and first power lines electrically connected between the light emitting pixel drivers and the first power supply line, wherein one of the light emitting elements is electrically connected between one of the light emitting pixel drivers and the second power, and wherein the one of the light emitting pixel drivers includes: a first transistor configured to generate a driving current for driving the one of the light emitting elements; a second transistor electrically connected between one of the data lines and a first electrode of the first transistor; a third transistor electrically connected between a gate electrode of the first transistor and a second electrode of the first transistor; a fourth transistor electrically connected between the gate electrode of the first transistor and a first initialization power line configured to transmit a first initialization power; a fifth transistor electrically connected between the first power line and the first electrode of the first transistor; a sixth transistor electrically connected between the second electrode of the first transistor and the one of the light emitting elements; a seventh transistor electrically connected between the one of the light emitting elements and a second initialization power line configured to transmit a second initialization power; and an eighth transistor electrically connected between the first electrode of the first transistor and a bias power line configured to transmit a bias power and.

In some embodiments, the circuit layer includes: a buffer layer covering a light blocking layer on the substrate; a first semiconductor layer on the buffer layer; a first gate insulating layer covering the first semiconductor layer; a first gate conductive layer on the first gate insulating layer; a second gate insulating layer covering the first gate conductive layer; a second gate conductive layer on the second gate insulating layer; a first interlayer insulating layer covering the second gate conductive layer; a second semiconductor layer on the first interlayer insulating layer; a third gate insulating layer covering the second semiconductor layer; a third gate conductive layer on the third gate insulating layer; a second interlayer insulating layer covering the third gate conductive layer; a first source-drain conductive layer on the second interlayer insulating layer; a first planarization layer covering the first source-drain conductive layer; a second source-drain conductive layer on the first planarization layer; and a second planarization layer covering the second source-drain conductive layer, wherein a channel portion, a source portion, and a drain portion of each of the first transistor, the second transistor, the fifth transistor, the sixth transistor, the seventh transistor, and the eighth transistor are on the first semiconductor layer, and wherein a channel portion, a source portion, and a drain portion of each of the third transistor and the fourth transistor are as a part of the second semiconductor layer.

In some embodiments, a gate electrode of the fourth transistor is electrically connected to a scan initialization line configured to transmit a scan initialization signal, wherein the first initialization power line is spaced apart from the scan initialization line and as another part of the second semiconductor layer, wherein the scan initialization line is on the third gate conductive layer, wherein the first auxiliary lines, the connection auxiliary electrodes, and the data connection electrodes are on the first source-drain conductive layer, wherein the data lines, the second auxiliary lines, the auxiliary protrusion electrodes, the data protrusion electrodes, and the first power lines are on the second source-drain conductive layer, wherein each of the auxiliary connection holes and the data connection holes penetrates the first planarization layer, and wherein the first auxiliary lines and the connection auxiliary electrodes overlap the first initialization power line and are spaced apart from the scan initialization line.

In some embodiments, the first auxiliary lines further include second power auxiliary horizontal lines electrically connected to the second power supply line, wherein the second auxiliary lines further include second power auxiliary vertical lines electrically connected to the second power auxiliary horizontal lines and the second power supply line, wherein one of the second power auxiliary horizontal lines is electrically connected to at least one of the second power auxiliary vertical lines, and wherein the circuit layer further includes at least one third connection line connecting at least one connection auxiliary electrode adjacent to a crossing between the one of the second power auxiliary horizontal lines and the at least one of the second power auxiliary vertical lines to the one of the second power auxiliary horizontal lines.

That is, according to some embodiments, the circuit layer includes connection auxiliary electrodes adjacent to crossings (e.g., intersections) between the first auxiliary lines and the second auxiliary lines and spaced apart from the first auxiliary lines, and auxiliary protrusion electrodes protruding from the second auxiliary lines, and respectively electrically connected to the connection auxiliary electrodes through an auxiliary connection hole. Here, connection auxiliary electrodes may include the first connection auxiliary electrode adjacent to a crossing (e.g., an intersection) between the first bypass auxiliary line and the second bypass auxiliary line; second connection auxiliary electrodes adjacent to intersections between second power auxiliary horizontal lines and second power auxiliary vertical lines; and third connection auxiliary electrodes adjacent to crossings (e.g., intersections) between the first bypass auxiliary line and the second power auxiliary vertical lines.

As described above, according to some embodiments, all the connection auxiliary electrodes adjacent to the crossings (e.g., intersections) between the first auxiliary lines and the second auxiliary lines may be respectively electrically connected to the auxiliary protrusion electrodes through the auxiliary connection hole. That is, all of the connection auxiliary electrodes may overlap the auxiliary connection hole.

Accordingly, visibility of the connection auxiliary electrodes and visibility of the crossings (e.g., intersections) between the first auxiliary lines and the second auxiliary lines adjacent to the connection auxiliary electrodes may be prevented from being increased due to the arrangement of the auxiliary connection holes.

Therefore, deterioration in display quality of the display device due to the first auxiliary lines and the second auxiliary lines for reducing the width of the non-display area can be reduced.

The effects of the present disclosure are not limited to the aforementioned effects, and various other effects are included in the present specification.

BRIEF DESCRIPTION OF DRAWINGS

The above and other aspects and features of the present disclosure will become more apparent by describing in detail some embodiments thereof with reference to the attached drawings, in which:

FIG. 1 is a perspective view illustrating a display device according to some embodiments of the present disclosure;

FIG. 4 is a layout diagram illustrating the region B of FIG. 2, according to some embodiments of the present disclosure;

DETAILED DESCRIPTION

Figure 2:
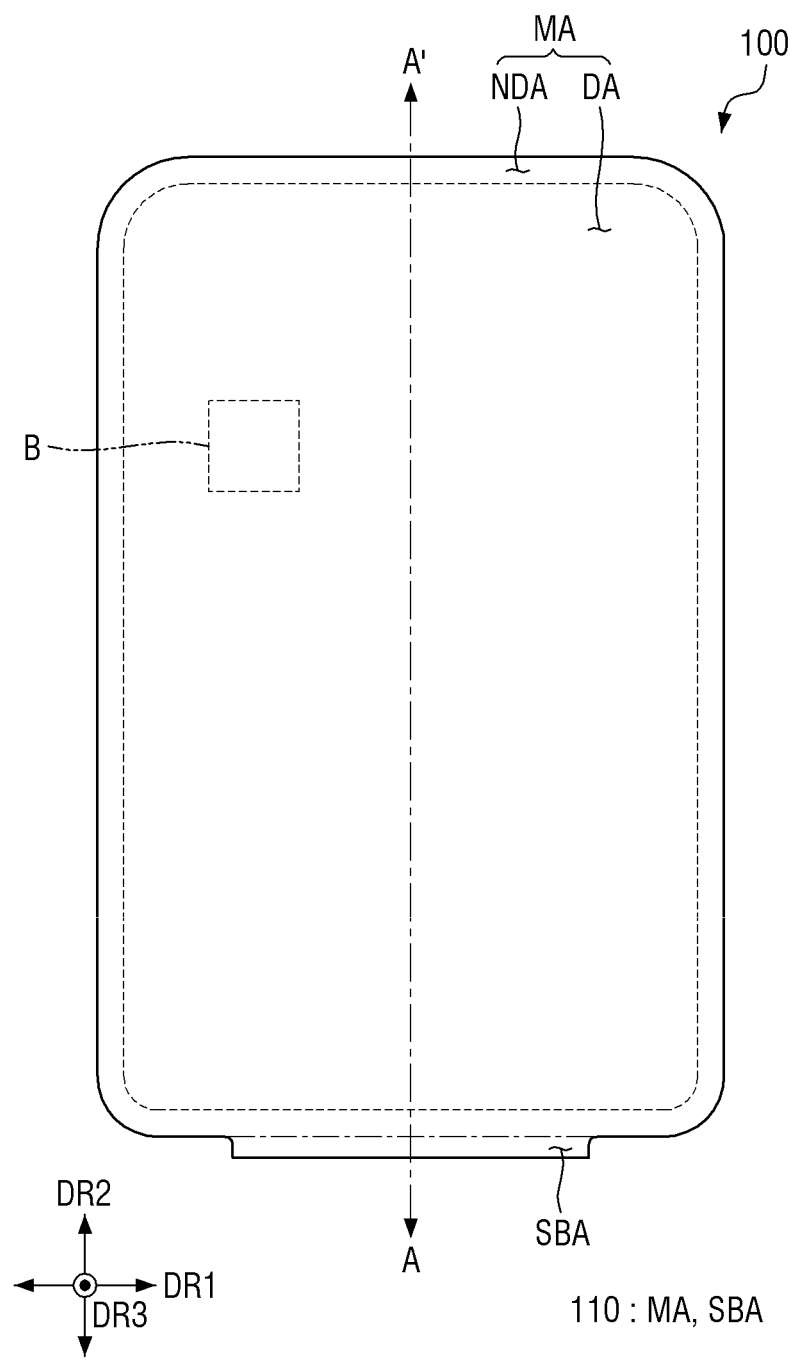
FIG. 2 is a plan view illustrating the display device of FIG. 1, according to some embodiments of the present disclosure.

Embodiments of the present disclosure will now be described more fully hereinafter with reference to the accompanying drawings. The embodiments may, however, be provided in different forms and should not be construed as limiting. The same reference numbers indicate the same components throughout the present disclosure. In the accompanying figures, the thickness of layers and regions may be exaggerated for clarity.

Some of the parts that are not associated with the description may not be provided to describe some embodiments of the present disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and/or vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the spirit and scope of the present disclosure herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within +30%, 20%, 10%, or 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." Expressions such as "one or more of" and "at least one of," when preceding a list of elements, modify the entire list of elements and do not modify the individual elements of the list. For example, the expression "one or more of A, B, and C," "at least one of A, B, or C," "at least one of A, B, and C," and "at least one selected from the group consisting of A, B, and C" indicates only A, only B, only C, both A and B, both A and C, both B and C, or all of A, B, and C.

Unless otherwise defined or implied, all terms used herein (including technical and scientific terms) have the same meaning as commonly understood by those skilled in the art to which the present disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, some embodiments will be described with reference to the accompanying drawings.

Figure 3:
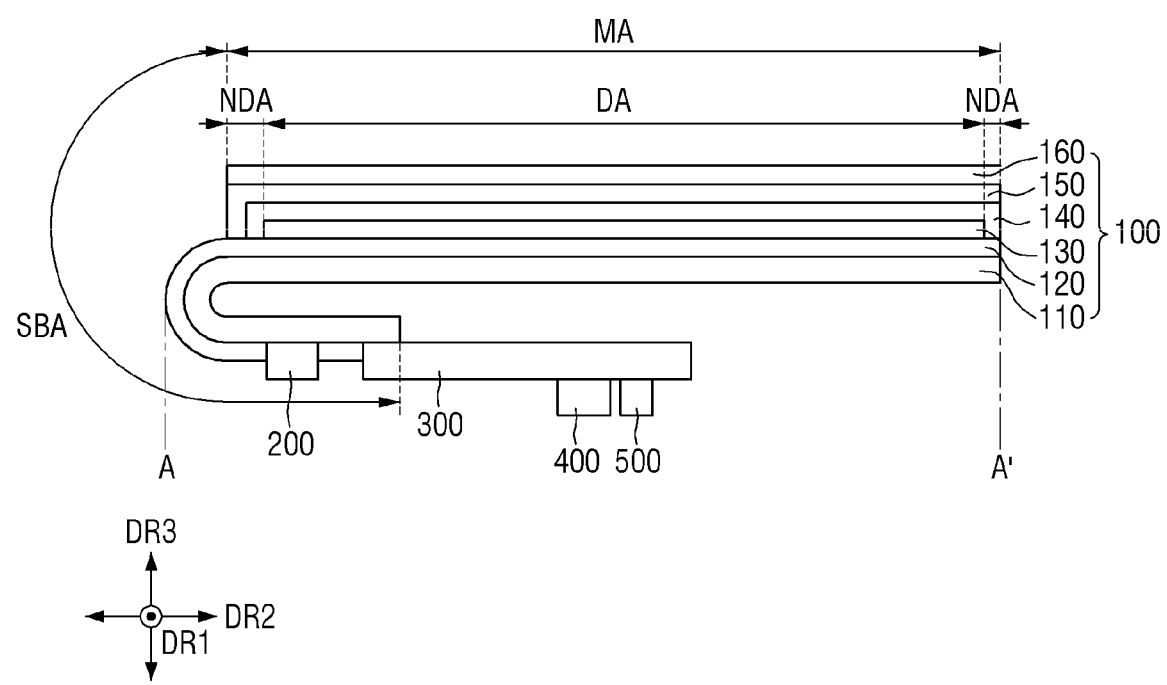
FIG. 3 is a cross-sectional view taken along the line A-A' of FIG. 2, according to some embodiments of the present disclosure.

FIG. 1 is a perspective view illustrating a display device according to some embodiments of the present disclosure. FIG. 2 is a plan view illustrating the display device of FIG. 1, according to some embodiments of the present disclosure. FIG. 3 is a cross-sectional view taken along the line A-A' of FIG. 2, according to some embodiments of the present disclosure. FIG. 4 is a layout diagram illustrating the region B of FIG. 2, according to some embodiments of the present disclosure.

Referring to FIGS. 1 and 2, a display device 100 is a device for displaying a moving image or a still image. The display device 10 may be used as a display screen of various devices, such as a television, a laptop computer, a monitor, a billboard and an Internet-of-Things (IoT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 100 may be a light emitting display device such as an organic light emitting display using an organic light emitting diode, a quantum dot light emitting display including a quantum dot light emitting layer, an inorganic light emitting display including an inorganic semiconductor, or a micro light emitting display using a micro or nano light emitting diode (LED). In the following description, it is assumed that the display device 100 is an organic light emitting display device. However, the present disclosure is not limited thereto, and may be applied to a display device including an organic insulating material, an organic light emitting material, and/or a metal material.

The display device 100 may be formed to be flat, but is not limited thereto. For example, the display device 100 may include a curved portion formed at left and right ends and having a constant curvature or a varying curvature. In addition, the display device 100 may be formed flexibly so that it can be curved, bent, folded, or rolled.

As illustrated in FIGS. 1, 2 and 3, the display device 100 includes a substrate 110.

The substrate 110 may include a main region MA corresponding to a display surface of the display device 100 and a sub-region SBA protruding from one side of the main region MA.

As shown in FIG. 2, the main region MA may include a display area DA disposed at most of the center thereof, and a non-display area NDA disposed around the display area DA.

The display area DA may, in a plan view, have a rectangular shape having short sides in a first direction DR1 and long sides in a second direction DR2 crossing the first direction DR1. The corner where the short side in the first direction DR1 and the long side in the second direction DR2 meet may be rounded to have a predetermined curvature or may be right-angled. The planar shape of the display area DA is not limited to the rectangular shape, and may be formed in another polygonal shape, a circular shape, an elliptical shape, or any other suitable shape.

The non-display area NDA may be disposed at the edge of the main region MA to surround the display area DA.

The sub-region SBA may be a region protruding from the non-display area NDA of the main region MA to one side in the second direction DR2.

Because a part of the sub-region SBA is transformed to be bent, another part of the sub-region SBA may be disposed on the rear surface of the display device 100.

FIGS. 2 and 3 illustrate the display device 100 with a part of the sub-region SBA in a bent state.

Referring to FIG. 3, the display device 100 according to some embodiments includes the substrate 110, a circuit layer 120 disposed on the substrate 110, and an element layer 130 disposed on the circuit layer 120.

The display device 100 according to some embodiments may further include an encapsulation layer 140 disposed on the element layer 130, and a touch sensor layer 150 disposed on the encapsulation layer 140.

Also, the display device 100 according to some embodiments further includes a polarization layer 160 disposed on the touch sensor layer 150 to reduce reflection of external light.

The substrate 110 may be formed of an insulating material such as a polymer resin. For example, the substrate 110 may be formed of polyimide. The substrate 110 may be a flexible substrate which can be bent, folded, or rolled.

In some examples, the substrate 110 may be formed of an insulating material such as glass or the like.

The substrate 110 may include a main region MA and a sub-region SBA. The main region MA may include the display area DA and the non-display area NDA.

FIG. 4 is a layout diagram illustrating the region B of FIG. 2.

Referring to FIG. 4, the display area DA of the display device 100 according to some embodiments may include the emission areas EA. In addition, the display area DA may further include non-emission areas NEA disposed in gaps between the emission areas EA.

Light emitting pixel drivers EPD corresponding to the emission areas EA may be arranged in the display area DA in parallel with each other in the first direction DR1 and the second direction DR2. The light emitting pixel drivers EPD may be respectively electrically connected to light emitting elements LE (see, e.g., FIG. 5) of the element layer 130 disposed in the emission areas EA.

The emission areas EA may have a rhombus planar shape or a rectangular planar shape. However, this is only an example, and the planar shape of the emission areas EA according to some embodiments is not limited to that illustrated in FIG. 5, and may have any suitable shape. For example, in a plan view, the emission areas EA may have a polygonal shape such as a square, a pentagon, a hexagon, etc., or may have a circular or elliptical shape including the edge of a curve.

The emission areas EA may include first emission areas EA1 emitting light of a first color in a predetermined wavelength band, second emission areas EA2 emitting light of a second color in a wavelength band lower than that of the first color, and third emission areas EA3 emitting light of a third color in a wavelength band lower than that of the second color.

For example, the first color may be red having a wavelength band of about 600 nm to about 750 nm. The second color may be green having a wavelength band of about 480 nm to about 560 nm. The third color may be blue having a wavelength band of about 370 nm to about 460 nm.

The first emission areas EA1 and the third emission areas EA3 may be alternately arranged in at least one of the first direction DR1 and the second direction DR2.

The second emission areas EA2 may be arranged side by side in at least one of the first direction DR1 and the second direction DR2.

In addition, the second emission areas EA2 may be adjacent to the first emission areas EA1 and the third emission areas EA3 in diagonal directions DR4 and DR5 intersecting the first direction DR1 and the second direction DR2.

Pixels PX displaying their own luminances and colors may be provided by the first emission area EA1, the second emission area EA2, and the third emission area EA3 adjacent to each other among these emission areas EA.

In other words, the pixels PX may be a basic unit for displaying various suitable colors including white with a predetermined luminance.

Each of the pixels PX may include at least one first emission area EA1, at least one second emission area EA2, and at least one third emission area EA3 that are adjacent to each other. Accordingly, each of the pixels PX may display various suitable colors through a mixture of the light emitted from the first emission area EA1, the second emission area EA2, and the third emission area EA3 that are adjacent to each other.

Figure 5:
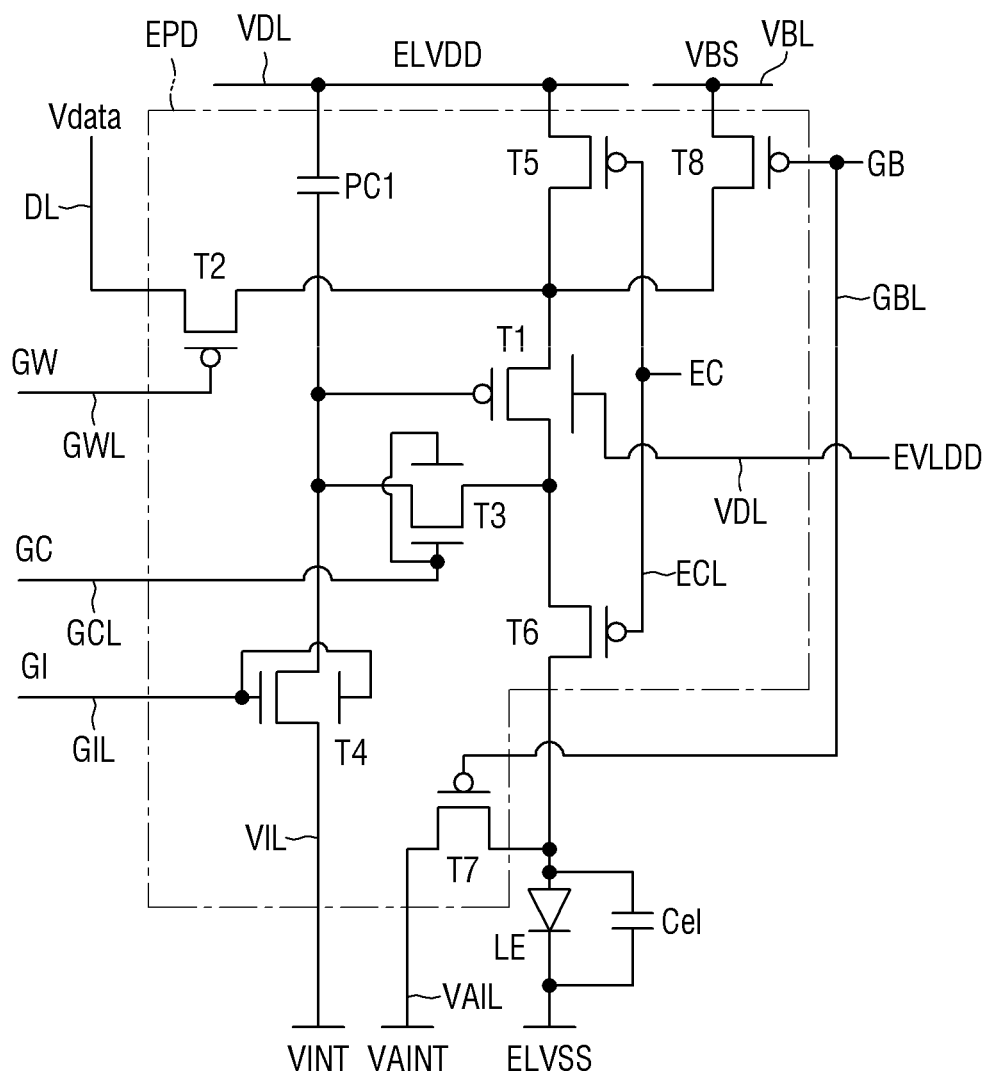
FIG. 5 is an equivalent circuit diagram showing the light emitting pixel driver of FIG. 4, according to some embodiments of the present disclosure.

FIG. 5 is an equivalent circuit diagram showing the light emitting pixel driver of FIG. 4, according to some embodiments of the present disclosure.

Referring to FIG. 5, one of the light emitting elements LE of the element layer 130 may be electrically connected between one of the light emitting pixel drivers EPD of the circuit layer 120 and a second power source ELVSS.

That is, the anode electrode 131 (see, e.g., FIG. 6) of the light emitting element LE is electrically connected to the light emitting pixel driver EPD, and the cathode electrode 134 (see, e.g., FIG. 6) of the light emitting element LE may be applied with a second power ELVSS lower than a first power ELVDD.

A capacitor Cel connected in parallel with the light emitting element LE refers to a parasitic capacitance between the anode electrode 131 and the cathode electrode 134.

The circuit layer 120 may further include a first power line VDL for transmitting the first power ELVDD, a first initialization power line VIL for transmitting a first initialization power Vint, a second initialization power line VAIL for transmitting a second initialization power Vaint, and a bias power line VBL for transmitting a bias power VBS.

The circuit layer 120 may further include a scan write line GWL for transmitting a scan write signal GW, a scan initialization line GIL for transmitting a scan initialization signal GI, an emission control line ECL for transmitting an emission control signal EC, a gate control line GCL for transmitting a gate control signal GC, and a bias control line GBL for transmitting a bias control signal GB.

One light emitting pixel driver EPD of the circuit layer 120 may include a first transistor T1 configured to generate a driving current for driving the light emitting element LE, two or more transistors T2 to T8 electrically connected to the first transistor T1, and at least one capacitor PC1.

The first transistor T1 is connected in series with the light emitting element LE between the first power ELVDD and the second power ELVSS.

That is, the first electrode (e.g., the source electrode) of the first transistor T1 may be electrically connected to the first power line VDL through the fifth transistor T5. Further, the second electrode (e.g., the drain electrode) of the first transistor T1 may be electrically connected to the anode electrode 131 of the light emitting element LE through the sixth transistor T6.

The first electrode of the first transistor T1 may be electrically connected to the data line DL through the second transistor T2.

The gate electrode of the first transistor T1 may be electrically connected to the first power line VDL through the first capacitor PC1.

That is, the first capacitor PC1 may be electrically connected between the gate electrode of the first transistor T1 and the first power line VDL.

Accordingly, the potential of the gate electrode of the first transistor T1 may be maintained at the voltage charged in the first power line VDL.

Further, when the data signal Vdata of the data line DL is transmitted to the first electrode of the first transistor T1 through the turned-on second transistor T2, the voltage difference between the gate electrode of the first transistor T1 and the first electrode of the first transistor T1 may be a difference voltage between the first power ELVDD and the data signal Vdata.

At this time, when the voltage difference between the gate electrode of the first transistor T1 and the first electrode of the first transistor T1, that is, a gate-source voltage difference is above a threshold voltage, the first transistor T1 may be turned on to generate a drain-source current of the first transistor T1 corresponding to the data signal Vdata.

Then, when the fifth transistor T5 and the sixth transistor T6 are turned on, the first transistor T1 may be connected in series with the light emitting element LE between the first power line VDL and the second power line VSL. Accordingly, the drain-source current of the first transistor T1 corresponding to the data signal Vdata may be supplied as a driving current of the light emitting element LE.

Accordingly, the light emitting element LE may emit light having a luminance corresponding to the data signal Vdata.

The second transistor T2 may be electrically connected between the first electrode of the first transistor T1 and the data line DL. The second transistor T3 may be turned on by the scan write signal GW of the scan write line GWL.

The third transistor T3 may be electrically connected between the gate electrode of the first transistor T1 and the second electrode of the first transistor T1. The third transistor T3 may be turned on by the gate control signal GC of the gate control line GCL.

The fourth transistor T4 may be connected between the gate electrode of the first transistor T1 and the first initialization power line VIL. The fourth transistor T4 may be turned on by the scan initialization signal GI of the scan initialization line GIL.

Each of the third transistor T3 and the fourth transistor T4 may be implemented as an N-type MOSFET.

The fifth transistor T5 may be electrically connected between the first electrode of the first transistor T1 and the first power line VDL.

The sixth transistor T6 may be electrically connected between the second electrode of the first transistor T1 and the anode electrode 131 of the light emitting element LE.

The fifth transistor T5 and the sixth transistor T6 may be turned on by the emission control signal EC of the light emission control line ECL.

A seventh transistor T7 may be electrically connected between the anode electrode of the light emitting element LE and the second initialization power line VAIL. The seventh transistor T7 may be turned on by the bias control signal GB of the bias control line GBL.

The eighth transistor T8 may be connected between the first electrode of the first transistor T1 and the bias power line VBL.

The eighth transistor T8 may be turned on by the bias control signal GB of the bias control line GBL.

Among the first to eighth transistors T1 to T8, each of the transistors T1, T2, and T5 to T8 except for the third transistor T3 and the fourth transistor T4 may be implemented as a P-type MOSFET.

That is, while each of the third transistor T3 and the fourth transistor T4 among the first to eighth transistors T1 to T8 included in the light emitting pixel driver EPD is implemented as an N-type MOSFET, each of the remaining transistors T1, T2, and T5 to T8 except for these two may be implemented as a P-type MOSFET.

Accordingly, according to some embodiments, each of the third transistor T3 and the fourth transistor T4 may include a channel portion, a source portion, and a drain portion formed of a semiconductor layer different from those of the other transistors T1, T2, and T5 to T8.

Figure 6:
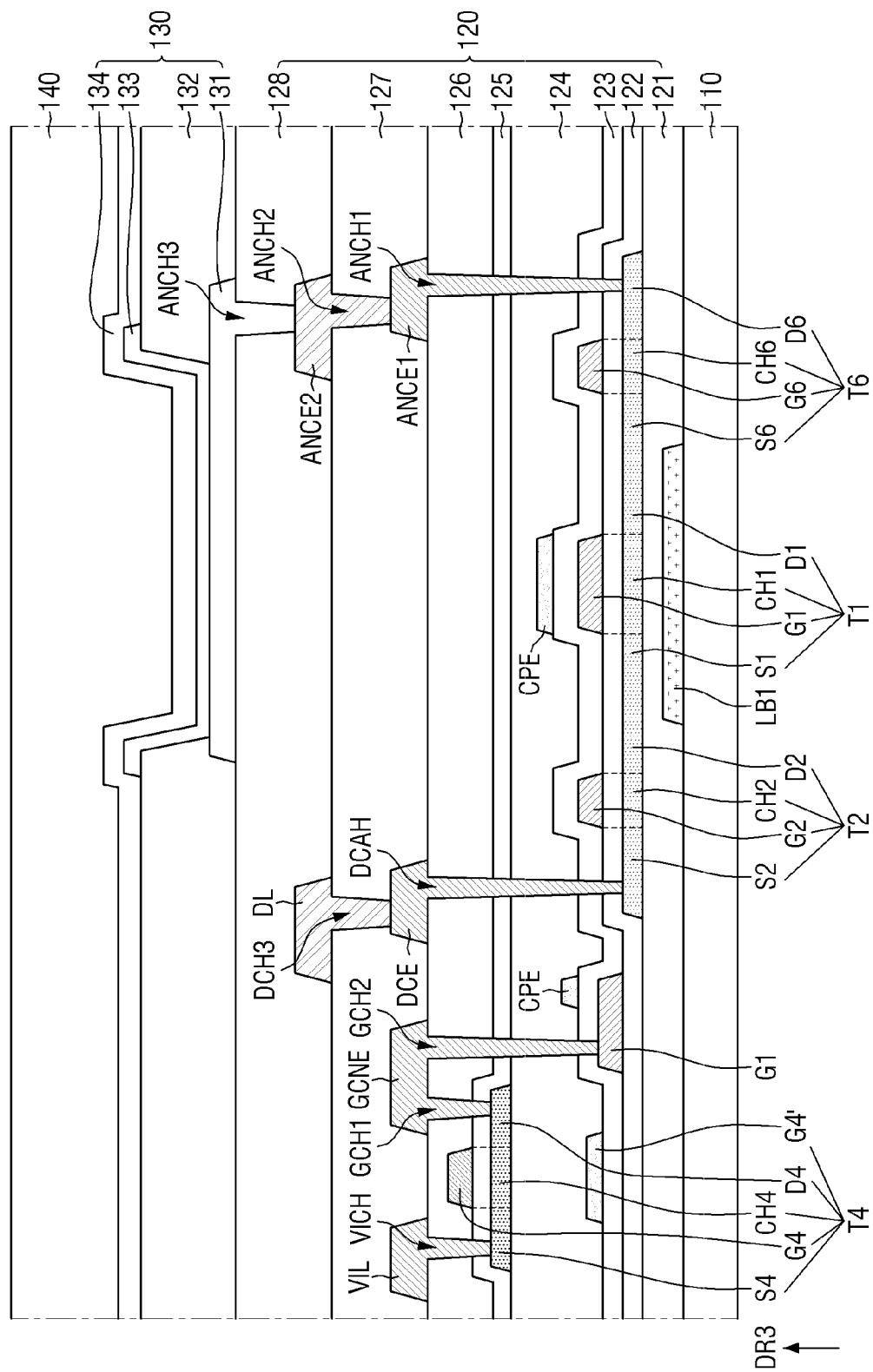
FIG. 6 is a cross-sectional view illustrating one light emitting element, and the first transistor, the second transistor, the fourth transistor, and the sixth transistor of FIG. 5, according to some embodiments of the present disclosure.

FIG. 6 is a cross-sectional view illustrating one light emitting element, and the first transistor, the second transistor, the fourth transistor, and the sixth transistor of FIG. 5, according to some embodiments of the present disclosure.

Referring to FIG. 6, the circuit layer 120 of the display device 100 according to some embodiments may include a buffer layer 121 covering a first light blocking layer LB1 on the substrate 110; a first semiconductor layer CH1, S1, D1, CH2, S2, D2, CH6, S6, and D6 disposed on the buffer layer 121; a first gate insulating layer 122 covering the first semiconductor layer CH1, S1, D1, CH2, S2, D2, CH6, S6, and D6; a first gate conductive layer G1, G2, and G6 disposed on the first gate insulating layer 122; a second gate insulating layer 123 covering the first gate conductive layer G1, G2, and G6; a second gate conductive layer CPE and LB2 disposed on the second gate insulating layer 123; a first interlayer insulating layer 124 covering the second gate conductive layer CPE and LB2; a second semiconductor layer CH4, S4, and D4 disposed on the first interlayer insulating layer 124; a third gate insulating layer 125 covering the second semiconductor layers CH4, S4, and D4; a third gate conductive layer G4 disposed on the third gate insulating layer 125; a second interlayer insulating layer 126 covering the third gate conductive layer G4; a first source-drain conductive layer ANCE1, DCE, GCNE, and VIL disposed on the second interlayer insulating layer 126; a first planarization layer 127 covering the first source-drain conductive layer ANCE1, DCE, GCNE, and VIL; a second source-drain conductive layer ANCE2 and DL disposed on the first planarization layer 127; and a second planarization layer 128 covering the second source-drain conductive layer ANCE2 and DL.

The first transistor T1 may include a channel portion CH1, a source portion S1, and a drain portion D1 formed of the first semiconductor layer that is on the buffer layer 121, and a gate electrode G1 disposed on the first gate conductive layer that is on the first gate insulating layer 122 and overlapping the channel portion CH1.

The channel portion CH1 of the first transistor T1 may overlap the first light blocking layer LB1 on the substrate 110.

The second transistor T2 may include a channel portion CH2, a source portion S2, and a drain portion D2 formed of the first semiconductor layer that is on the buffer layer 121, and a gate electrode G2 disposed on the first gate conductive layer that is on the first gate insulating layer 122 and overlapping the channel portion CH2.

The sixth transistor T6 may include a channel portion CH6, a source portion S6, and a drain portion D6 formed of the first semiconductor layer that is on the buffer layer 121, and a gate electrode G6 disposed on the first gate conductive layer that is on the first gate insulating layer 122 and overlapping the channel portion CH6.

The source portion S2 of the second transistor T2 may be electrically connected to the data line DL through a data connection electrode DCE.

The data connection electrode DCE may be disposed in the first source-drain conductive layer that is on the second interlayer insulating layer 126, and may be electrically connected to the source portion S2 of the second transistor T2 through a data connection auxiliary hole DCAH penetrating the second interlayer insulating layer 126, the third gate insulating layer 125, the first interlayer insulating layer 124, the second gate insulating layer 123, and the first gate insulating layer 122.

The data line DL may be disposed in the second source-drain conductive layer that is on the first planarization layer 127, and may be electrically connected to the data connection electrode DCE through a data connection hole DCH penetrating the first planarization layer 127.

The drain portion D2 of the second transistor T2 may be connected to the source portion S1 of the first transistor T1.

The drain portion D1 of the first transistor T1 may be connected to the source portion S6 of the sixth transistor T6.

The drain portion D6 of the sixth transistor T6 may be electrically connected to the anode electrode 131 through the first anode connection electrode ANCE1 and the second anode connection electrode ANCE2.

The first anode connection electrode ANCE1 may be disposed on the first source-drain conductive layer that is on the second interlayer insulating layer 126, and electrically connected to the drain portion D6 of the sixth transistor T6 through the first anode connection hole ANCH1 penetrating the second interlayer insulating layer 126, the third gate insulating layer 125, the first interlayer insulating layer 124, the second gate insulating layer 123, and the first gate insulating layer 122.

The second anode connection electrode ANCE2 may be disposed on the second source-drain conductive layer that is on the first planarization layer 127, and electrically connected to the first anode connection electrode ANCE1 through the second anode connection hole ANCH2 penetrating the first planarization layer 127.

The anode electrode 131 may be disposed on the second planarization layer 128, and may be electrically connected to the second anode connection electrode ANCE2 through a third anode connection hole ANCH3 penetrating the second planarization layer 128.

The first capacitor PC1 may be provided by an overlapping region between the capacitor electrode CPE disposed on the second gate conductive layer that is on the second gate insulating layer 123 and the gate electrode G1 of the first transistor T1.

The fourth transistor T4 may include a channel portion CH4, a source portion S4, and a drain portion D4 formed of the second semiconductor layer that is on the first interlayer insulating layer 124; a gate electrode G4 disposed in the third gate conductive layer that is on the third gate insulating layer 125; and a gate auxiliary electrode G4' disposed in the second gate conductive layer that is on the second gate insulating layer 123.

Each of the gate electrode G4 and the gate auxiliary electrode G4' may overlap the channel portion CH4 of the fourth transistor T4.

The source portion S4 of the fourth transistor T4 may be electrically connected to the first initialization power line VIL on the second interlayer insulating layer 127 through a hole penetrating the second interlayer insulating layer 127 and the third gate insulating layer 125.

The drain portion D4 of the fourth transistor T4 may be electrically connected to the gate electrode G1 of the first transistor T1 through a gate connection electrode GCNE disposed in the first source-drain conductive layer that is on the second interlayer insulating layer 127.

The gate connection electrode GCNE may be electrically connected to the drain portion D4 of the fourth transistor T4 through the first gate connection hole GCH1 penetrating the second interlayer insulating layer 127 and the third gate insulating layer 125.

The gate connection electrode GCNE may be electrically connected to the gate electrode G1 of the first transistor T1 through the second interlayer insulating layer 127, the third gate insulating layer 125, the first interlayer insulating layer 124, and the second gate insulating layer 123.

Because the third transistor T3 has a structure that is similar to that of the fourth transistor T4, and the fifth transistor T5 and the seventh transistor T7 have structures that are similar to those of the second transistor T2 and the sixth transistor T6, redundant descriptions may be omitted below.

The circuit layer 120 of the display device 100 according to some embodiments may include first auxiliary lines ASL1 (see, e.g., FIG. 8) and second auxiliary lines ASL2 (see, e.g., FIG. 8) to reduce the width of the non-display area NDA.

Figure 7:
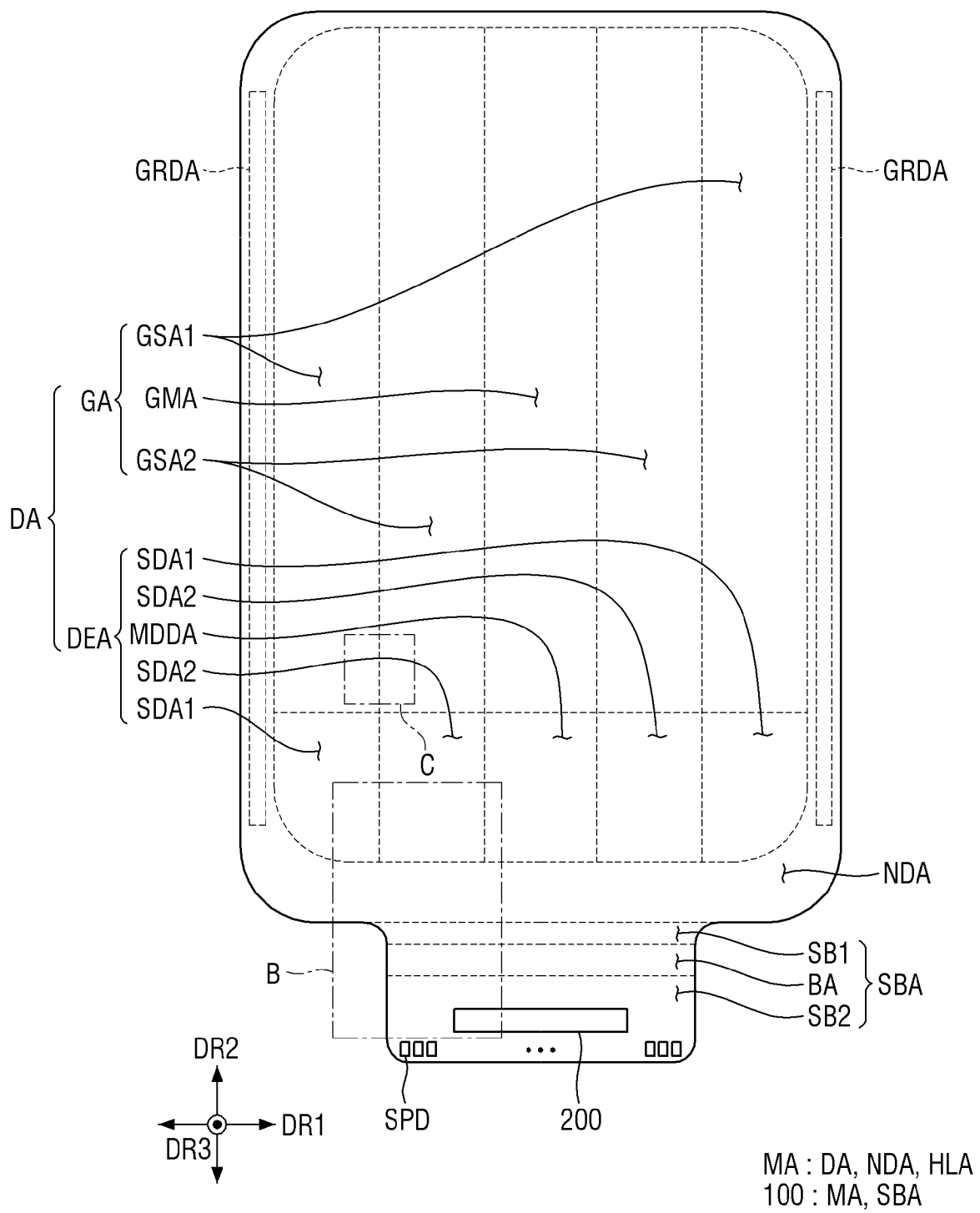
FIG. 7 is a plan view showing the substrate of FIG. 3, according to some embodiments of the present disclosure.

FIG. 7 is a plan view showing the substrate of FIG. 3, according to some embodiments of the present disclosure.

Referring to FIG. 7, the substrate 110 of the display device 100 according to some embodiments includes the main region MA corresponding to the display surface, and the sub-region SBA that protrudes from one side of the main region MA.

The main region MA may include the display area DA disposed at most of the center, and the non-display area NDA disposed at the periphery to surround the display area DA.

The display area DA may include a bypass area DEA disposed on one side adjacent to the sub-region SBA, and a general area GA disposed in the remaining area excluding the bypass area DEA.

The bypass area DEA may include a bypass middle area MDDA disposed at the center in the first direction DR1; a first bypass side area SDA1 parallel to the bypass middle area MDDA in the first direction DR1 and in contact with the non-display area NDA; and a second bypass side area SDA2 disposed between the bypass middle area MDDA and the first bypass side area SDA1.

The first bypass side area SDA1 may be disposed adjacent to the bent corner of a substrate 110 as compared to the bypass middle area MDDA and the second bypass side area SDA2.

The first bypass side area SDA1 and the second bypass side area SDA2 may be disposed between the bypass middle area MDDA and the non-display area NDA on both sides of the bypass middle area MDDA in the first direction DR1.

The general area GA may include a general middle area GMA connected to the bypass middle area MDDA of the bypass area DEA in the second direction DR2; a first general side area GSA1 connected to the first side area SDA1 of the bypass area DEA in the second direction DR2; and a second general side area GSA2 connected to the second side area SDA2 of the bypass area DEA in the second direction DR2.

The non-display area NDA may include a gate driving circuit area GDRA where a gate driving circuit is disposed.

The gate driving circuit area GDRA may be disposed in a portion of the non-display area NDA that is adjacent to at least one side of the display area DA in the first direction DR1.

The gate driving circuit of the gate driving circuit area GDRA may sequentially transmit gate signals to gate lines. Here, the gate lines may include the scan write line GWL (see, e.g., FIG. 5) that transmits the scan write signal GW (see, e.g., FIG. 5), the scan initialization line GIL (see, e.g., FIG. 5) that transmits the scan initialization signal GI (see, e.g., FIG. 5), the gate control line GCL (see, e.g., FIG. 5) that transmits the gate control signal GC (see, e.g., FIG. 5), the bias control line GBL (see, e.g., FIG. 5) that transmits the bias control signal GB (see, e.g., FIG. 5), and the emission control line ECL (see, e.g., FIG. 5) that transmits the emission control signal EC (see, e.g., FIG. 5).

The sub-region SBA may include a bending region BA that is transformed into a bending shape, a first sub-region SB1 disposed between one side of the bending region BA and the main region MA, and a second sub-region SB2 connected to the other side of the bending region BA.

When the bending region BA is transformed into a bending shape, the second sub-region SB2 is disposed below the substrate 110 and overlaps the main region MA.

The display driving circuit 200 may be disposed in the second sub-region SB2.

The signal pads SPD bonded to the circuit board 300 may be disposed at one edge of the second sub-region SB2.

Figure 8:
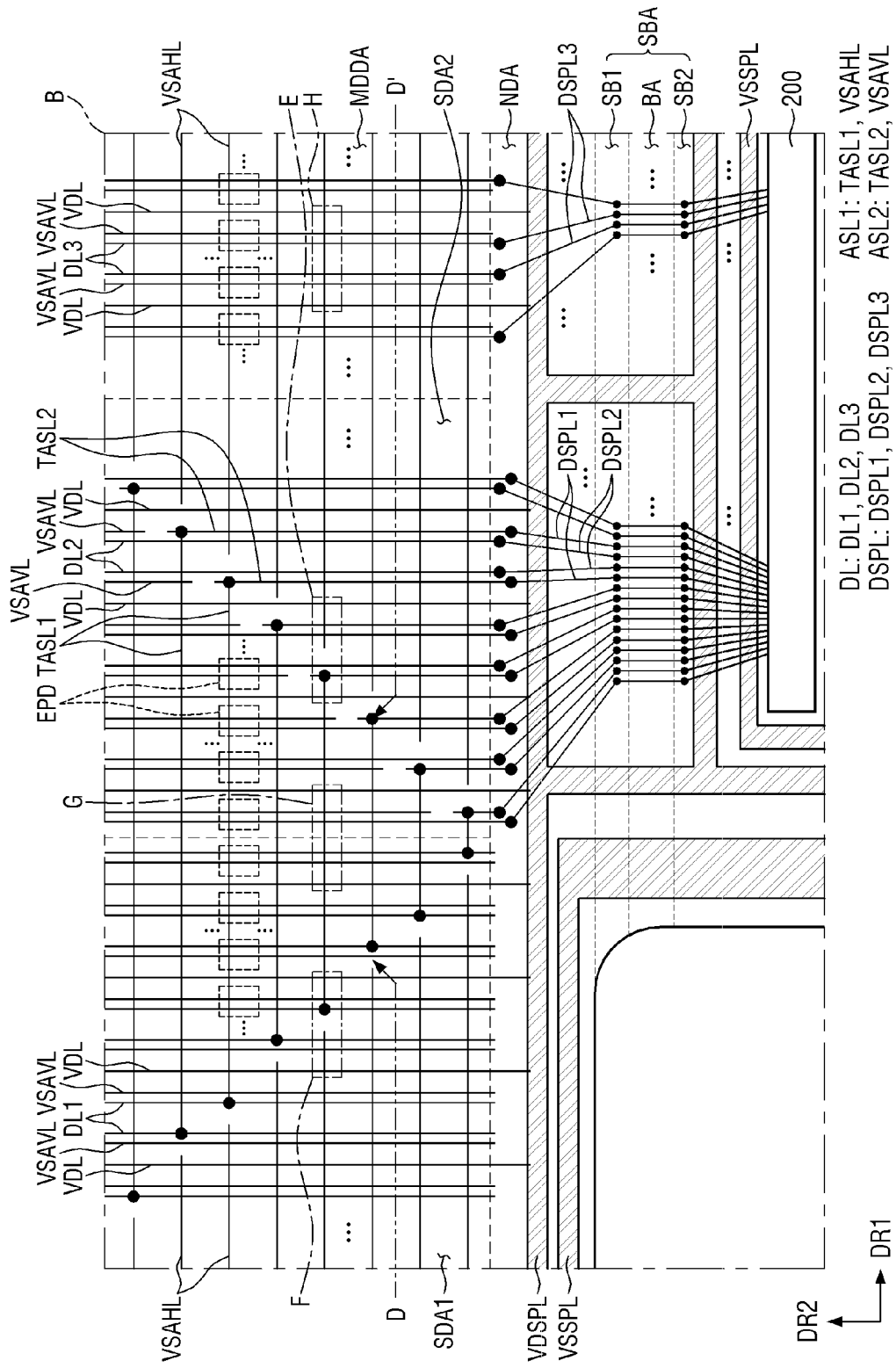
FIG. 8 is a layout diagram illustrating the region B of FIG. 7, according to some embodiments of the present disclosure.
Figure 9:
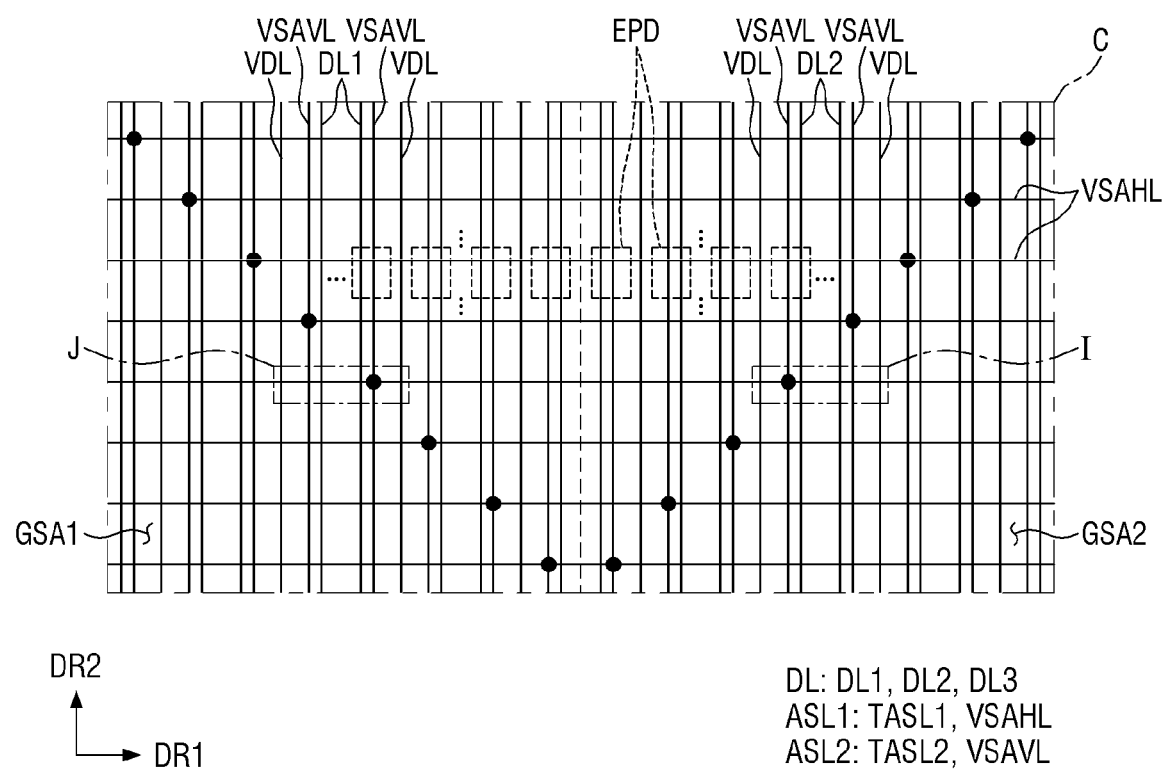
FIG. 9 is a layout diagram illustrating the region C of FIG. 7, according to some embodiments of the present disclosure.
Figure 10:
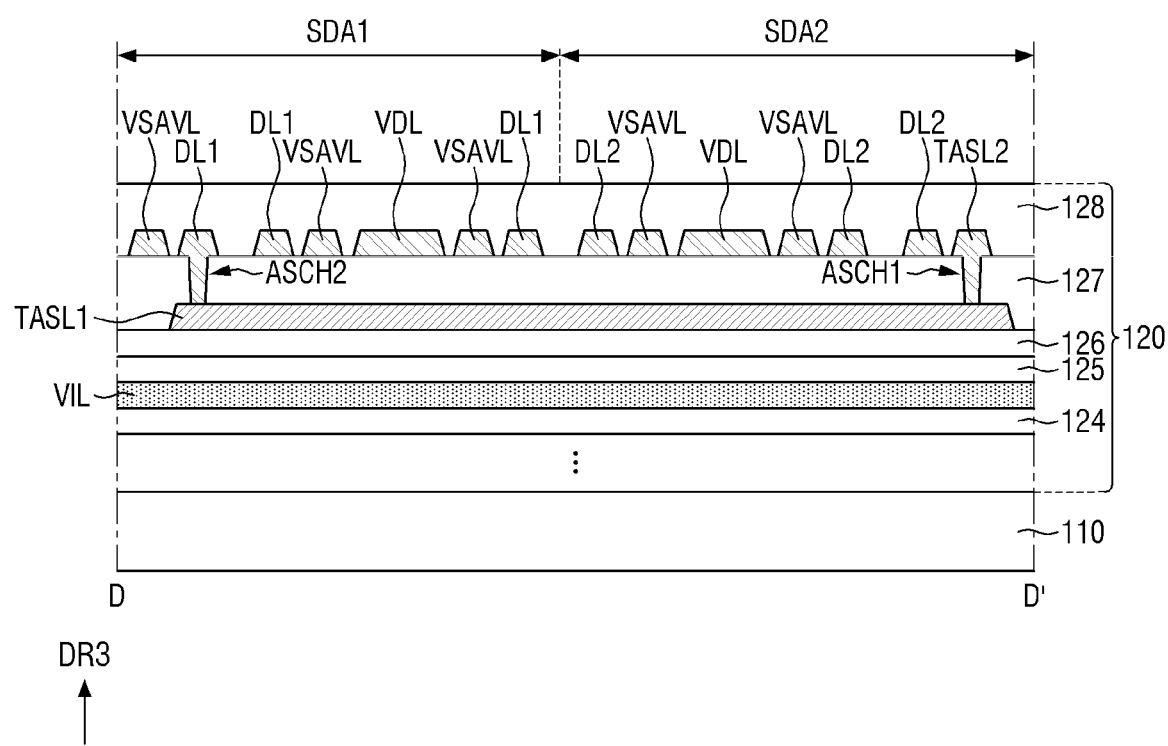
FIG. 10 is a cross-sectional view taken along the line D-D' of FIG. 8, according to some embodiments of the present disclosure.

FIG. 8 is a layout diagram illustrating the region B of FIG. 7. FIG. 9 is a layout diagram illustrating the region C of FIG. 7, according to some embodiments of the present disclosure. FIG. 10 is a cross-sectional view taken along the line D-D' of FIG. 8, according to some embodiments of the present disclosure.

Referring to FIGS. 8 and 9, the circuit layer 120 of the display device 100 according to some embodiments may include the light emitting pixel drivers EPD electrically connected to the light emitting elements LE of the element layer 130, respectively; light sensing pixel drivers DPD electrically connected to light sensing elements PD of the element layer 130, respectively; the data lines DL electrically connected to the light emitting pixel drivers EPD and transmitting the data signal Vdata; the first auxiliary lines ASL1 extending in the first direction DR1 crossing the data lines DL; the second auxiliary lines ASL2 extending parallel to the data lines DL and paired with the data lines DL, respectively.

The data lines DL and the second auxiliary lines ASL2 may extend in the second direction DR2.

Among the data lines DL, two data lines DL adjacent to each other in the first direction DR1 may be disposed between two second auxiliary lines ASL2 paired with them so as to face each other in the first direction DR1.

According to some embodiments, the first auxiliary lines ASL1 may overlap the light emitting pixel drivers EPD of the display area DA. That is, the number of the first auxiliary lines ASL1 may be equal to the number of the columns of the emission areas EA in the first direction DR1.

According to some embodiments, the circuit layer 120 further includes a data supply line DSPL disposed in the non-display area NDA and electrically connected to the display driving circuit 200 and the data lines DL.

The data lines DL may include a first data line DL1 disposed in the first bypass side area SDA1 and a second data line DL2 disposed in the second bypass side area SDA2.

The first auxiliary lines ASL1 may include a first bypass auxiliary line TASL1 electrically connected to the first data line DL1 of the first bypass side area SDA1.

The second auxiliary lines ASL2 may include a second bypass auxiliary line TASL2 paired with the second data line DL2 of the second bypass side area SDA2 and electrically connected to the first bypass auxiliary line TASL1.

The data supply lines DSPL may include a first data supply line DSPL1 that transmits the data signal of the first data line DL1, and a second data supply line DSPL2 that transmits the data signal of the second data line DL2.

According to some embodiments, the data supply lines DSPL may extend to the second bypass side area SDA2 and the bypass middle area MDDA.

Accordingly, the first data supply line DSPL1 may extend to the second bypass auxiliary line TASL2 of the second bypass side area SDA2, and may be electrically connected to the first data line DL1 through the second bypass auxiliary line TASL2 and the first bypass auxiliary line TASL1.

1 The second data supply line DSPL2 may extend to the second bypass side area SDA2, and may be electrically connected to the second data line DL2 directly.

In this way, because the first data supply line DSPL1 does not extend to the first data line DL1 of the first bypass side area SDA1 and extends to the second bypass auxiliary line TASL2 of the second bypass side area SDA2, the extension length of the first data supply line DSPL1 may be shortened. As a result, the width of the area utilized for the arrangement of the data supply lines DSPL may be reduced, so that the width of the non-display area NDA may be reduced.

In addition, because the data supply lines DSPL are not disposed in a portion of the non-display area NDA located between the bent corner of the substrate 110 and the first bypass side area SDA1, the width of the non-display area NDA can be further reduced.

The data lines DL may further include a third data line DL3 disposed in the bypass middle area MDDA. In addition, the data supply lines DSPL may further include a third data supply line DSPL3 that transmits the data signal of the third data line DL3.

The third data supply line DSPL3 may extend to the bypass middle area MDDA, and may be electrically connected to the third data line DL3 directly.

The first bypass auxiliary line TASL1 extends from the second bypass auxiliary line TASL2 to the first data line DL1.

The second bypass auxiliary line TASL2 extends from the first data supply line DSPL1 of the non-display area NDA to the first bypass auxiliary line TASL1.

In this way, as the first bypass auxiliary line TASL1 and the second bypass auxiliary line TASL2 are limitedly arranged in the bypass area DEA, the ends of the first bypass auxiliary line TASL1 and the ends of the second bypass auxiliary line TASL2 are arranged with regularity. Accordingly, the first bypass auxiliary line TASL1 and the second bypass auxiliary line TASL2 may become more visible.

To prevent this, the first auxiliary lines ASL1 may further include not only the first bypass auxiliary line TASL1 but also second power auxiliary horizontal lines VSAHL. Also, the second auxiliary lines ASL2 may further include not only the second bypass auxiliary lines TASL2 but also second power auxiliary vertical lines VSAVL.

Two of the second power auxiliary horizontal lines VSAHL may extend from both ends of the first bypass auxiliary line TASL1 to the non-display area NDA.

One of the second power auxiliary vertical lines VSAVL may extend from one end of the second bypass auxiliary line TASL2 to the non-display area NDA in a direction away from the sub-region SBA.

Accordingly, a part of each second data line DL2 is paired with the second bypass auxiliary line TASL2, and the other part of the second data line DL2 may be paired with the one second power auxiliary vertical line VSAVL extending from the one end of the second bypass auxiliary line TASL2.

Because the second bypass auxiliary line TASL2 is disposed only in the second bypass side area SDA2, the first data line DL1 of the first bypass side area SDA1 may be paired with the second power auxiliary vertical line VSAVL.

The third data line DL3 of the bypass middle area MDDA may be paired with the second power auxiliary vertical line VSAVL.

As shown in FIG. 9, among the first auxiliary lines ASL1, the first bypass auxiliary line TASL1 may be disposed in the first bypass side area SDA1 and the second bypass side area SDA2 of the bypass area DEA, and the second power auxiliary horizontal lines VSAHL may be disposed in the bypass middle area MDDA of the bypass area DEA.

Also, as illustrated in FIG. 10, the second power auxiliary horizontal lines VSAHL and the second power auxiliary vertical lines VSAVL may be disposed in the general area GA.

As shown in FIG. 8, the circuit layer 120 may further include the first power supply line VDSPL and the second power supply line VSSPL that transmit the first power EDVDD and the second power ELVSS for driving the light emitting elements LE, respectively.

The first power supply line VDSPL and the second power supply line VSSPL may be disposed in the non-display area NDA and may extend to the sub-region SBA.

The first power supply line VDSPL may be electrically connected to a first power pad for the transmission of the first power ELVDD among signal pads SPD disposed in the second sub-region SB2.

The second power supply line VSSPL may be electrically connected to a second power pad for the transmission of the second power ELVSS among the signal pads SPD disposed in the second sub-region SB2.

The second power auxiliary horizontal lines VSAHL may be electrically connected to the second power supply line VSSPL.

The second power auxiliary vertical lines VSAVL may be electrically connected to the second power auxiliary horizontal lines VSAHL and the second power supply line VSSPL.

According to some embodiments, the circuit layer 120 further includes the first power lines VDL electrically connected between the light emitting pixel drivers EPD and the first power supply line VDSPL.

The first power lines VDL may be disposed between two second auxiliary lines ASL2 adjacent to each other in the first direction DR1.

Referring to FIG. 10, the data lines DL, the second auxiliary lines ASL2, and the first power lines VDL may be disposed on the first planarization layer 127 covering the first auxiliary lines ASL1.

That is, the first auxiliary lines ASL1 may be disposed in the first source-drain conductive layer that is on the second interlayer insulating layer 126.

The data lines DL, the second auxiliary lines ASL2, and the first power lines VDL may be disposed in the second source-drain conductive layer that is on the first planarization layer 127.

The second bypass auxiliary line TASL2 may be electrically connected to the first bypass auxiliary line TASL1 through a first auxiliary connection hole ASCH1 penetrating the first planarization layer 127.

The first data line DL1 may be electrically connected to the first bypass auxiliary line TASL1 through a second auxiliary connection hole ASCH2 penetrating the first planarization layer 127.

According to some embodiments, to prevent signals of lines adjacent to the first bypass auxiliary line TASL1 from being distorted due to poor coupling (e.g., poor signal coupling) with data signals of the first bypass auxiliary line TASL1 extending in the first direction DR1, the first bypass auxiliary line TASL1 overlaps the first initialization power line VIL.

According to some embodiments, the first auxiliary lines ASL1 including the first bypass auxiliary line TASL1 overlaps the first initialization power lines VIL. With this configuration, the influence of the data signal of the first bypass auxiliary line TASL1 on the gate control signal GC of the gate control line GCL or the scan initialization signal GI of the scan initialization line GIL may be reduced.

To sequentially arrange the first bypass auxiliary lines TASL1 in the bypass area DEA, the first data lines DL1 of the first bypass side area SDA1 may be electrically connected to the first bypass auxiliary line TASL1 having a longer length as they are located farther from the second bypass side area SDA2. Therefore, as ends of the first bypass auxiliary lines TASL1 are arranged in a diagonal direction, the first bypass auxiliary lines TASL1 may become more visible.

In addition, because the auxiliary connection holes ASCH for electrical connection between each of the data lines DL and the second auxiliary lines ASL2 and the first auxiliary lines ASL1 penetrate the first planarization layer 127, they may be arranged in a relatively wide width.

Because the auxiliary connection hole ASCH is disposed at each of the ends of the first bypass auxiliary lines TASL1, the first bypass auxiliary lines TASL1 may become more visible due to the arrangement of the auxiliary connection holes ASCH.

Hereinafter, various embodiments for lowering the visibility of the first bypass auxiliary lines TASL1 will be described.

FIGS. 11, 12, 13, 14, 15, and 16 are plan views respectively illustrating the regions E, F, G, and H of FIG. 8 and parts I and J of FIG. 9 according to some embodiments of the present disclosure.

Figure 11:
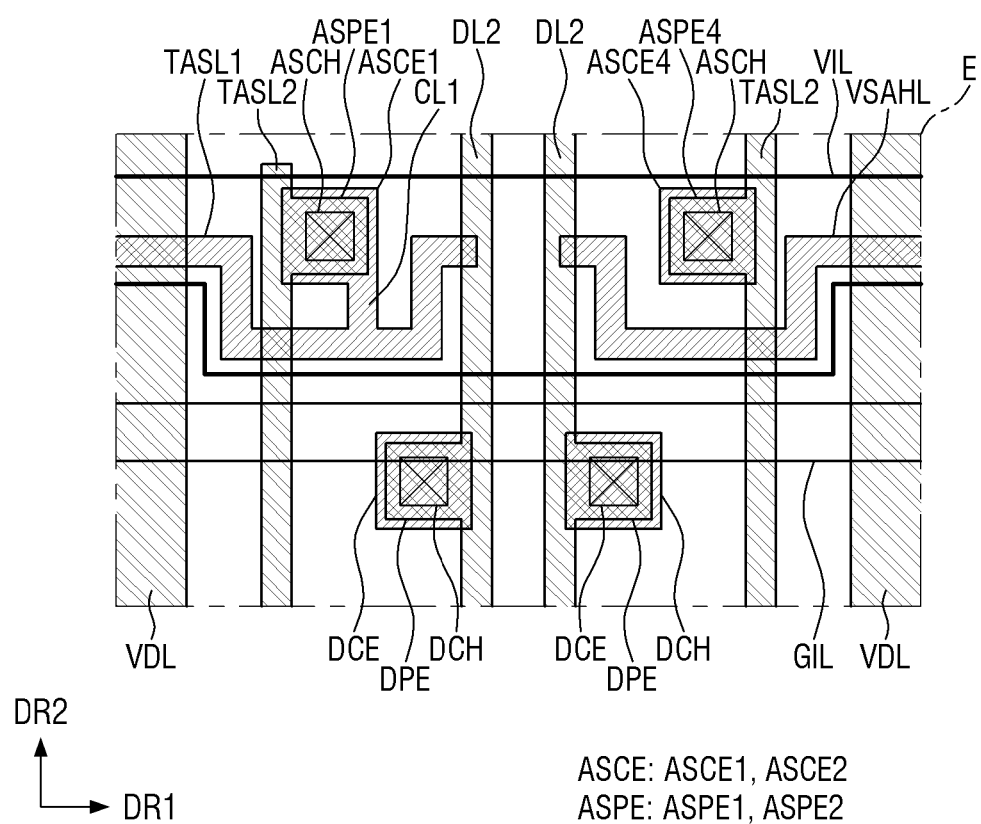
FIGS. 11, 12, 13, 14, 15, and 16 are plan views respectively illustrating the regions E, F, G, and H of FIG. 8 and parts I and J of FIG. 9 according to some embodiments of the present disclosure.

Referring to FIG. 11, the circuit layer 120 of the display device 100 according to some embodiments may further include a first connection auxiliary electrode ASCE1 adjacent to a crossing (e.g., an intersection) between the first bypass auxiliary line TASL1 and the second bypass auxiliary line TASL2 and spaced apart from the first bypass auxiliary line TASL1; a first connection line CL1 connecting the first bypass auxiliary line TASL1 to the first connection auxiliary electrode ASCE1; and a first auxiliary protrusion electrode ASPE1 protruding from the second bypass auxiliary line TASL2 and electrically connected to the first connection auxiliary electrode ASCE1 through the auxiliary connection hole ASCH.

The first connection auxiliary electrode ASCE1 and the first connection line CL1 may be disposed at the same layer as (e.g., in the same layer as) the first bypass auxiliary line TASL1, that is, in the first source-drain conductive layer, which is on the second interlayer insulating layer 126.

The first connection auxiliary electrode ASCE1 may face one side of the first bypass auxiliary line TASL1 in the second direction DR2.

The first bypass auxiliary line TASL1 extends in the first direction DR1, and may include a bent shape to surround a part of the edge of the first connection auxiliary electrode ASCE1.

The first connection line CL1 may extend between the first bypass auxiliary line TASL1 and the first connection auxiliary electrode ASCE1.

As an example, the first connection line CL1 may extend in the second direction DR2. However, this is merely an example, and the extension direction of the first connection line CL1 is not limited to that shown in FIG. 11.

The first connection auxiliary electrode ASCE1 has an island shape (e.g., a rectangular shape) spaced apart from the first bypass auxiliary line TASL1, and may be electrically connected to the first bypass auxiliary line TASL1 through the first connection line CL1.

The first auxiliary protrusion electrode ASPE1 may protrude in the first direction DR1 from the second bypass auxiliary line TASL2 extending in the second direction DR2.

The first auxiliary protrusion electrode ASPE1 may be electrically connected to the first connection auxiliary electrode ASCE1 through the auxiliary connection hole ASCH.

Accordingly, the second bypass auxiliary line TASL2 may be electrically connected to the first bypass auxiliary line TASL1 through the first auxiliary protrusion electrode ASPE1, the first connection auxiliary electrode ASCE1, and the first connection line CL1.

As illustrated in FIGS. 12, 14, 15, and 16, according to some embodiments, the circuit layer 120 further includes second connection auxiliary electrodes ASCE2 adjacent to crossings (e.g., intersections) between the second power auxiliary horizontal lines VSAHL and the second power auxiliary vertical lines VSAVL; and second auxiliary protrusion electrodes ASPE2 protruding from the second power auxiliary vertical lines VSAVL and respectively electrically connected to the second connection auxiliary electrodes ASCE2 through the auxiliary connection hole ASCH.

The second connection auxiliary electrodes ASCE2 may be disposed at the same layer as (e.g., in the same layer) as the first auxiliary lines ASL1 including the second power auxiliary horizontal lines VSAHL, that is, in the first source-drain conductive layer, which is on the second interlayer insulating layer 126.

The second connection auxiliary electrodes ASCE2 may face one side of the second power auxiliary horizontal lines VSAHL in the second direction DR2.

According to some embodiments, the second connection auxiliary electrodes ASCE2 have an island shape (e.g., a rectangular shape) spaced apart from the second power auxiliary horizontal lines VSAHL.

Therefore, even if the second auxiliary protrusion electrode ASPE2 protruding from the second power auxiliary vertical line VSAVL is electrically connected to the second connection auxiliary electrode ASCE2 through the auxiliary connection hole ASCH, electrical connection between the second power auxiliary horizontal line VSAHL and the second power auxiliary vertical line VSAVL is not achieved only by the second connection auxiliary electrode ASCE2 and the second auxiliary protrusion electrode ASPE2.

As described above with reference to FIG. 6, the second transistor T2 of the light emitting pixel driver EPD may be electrically connected to the data line DL through the data connection electrode DCE.

As shown in FIGS. 11, 12, 13, 14, 15 and 16, according to some embodiments, the data connection electrodes DCE are adjacent to crossings (e.g., intersections) between the data lines DL and the first auxiliary lines (ASL1 including TASL1 and VSAHL in FIG. 8), and may be spaced apart from the first auxiliary lines ASL1.

Also, data protrusion electrodes DPE protruding from the data lines DL may be respectively electrically connected to the data connection electrodes DCE through the data connection holes DCH.

That is, according to some embodiments, the circuit layer 120 may include the data connection electrodes DCE adjacent to the crossings (e.g., intersections) between the data lines DL and the first auxiliary lines (ASL1 including TASL1 and VSAHL in FIG. 8) and spaced apart from the first auxiliary lines ASL1; and the data protrusion electrodes DPE protruding from the data lines DL and respectively electrically connected to the data connection electrodes DCE through the data connection holes DCH.

The data connection electrodes DCE may face the other side (e.g., the opposite side) of the first auxiliary lines ASL1 including the first bypass auxiliary line TASL1 and the second power auxiliary horizontal line VSAHL in the second direction DR2.

Figure 12:
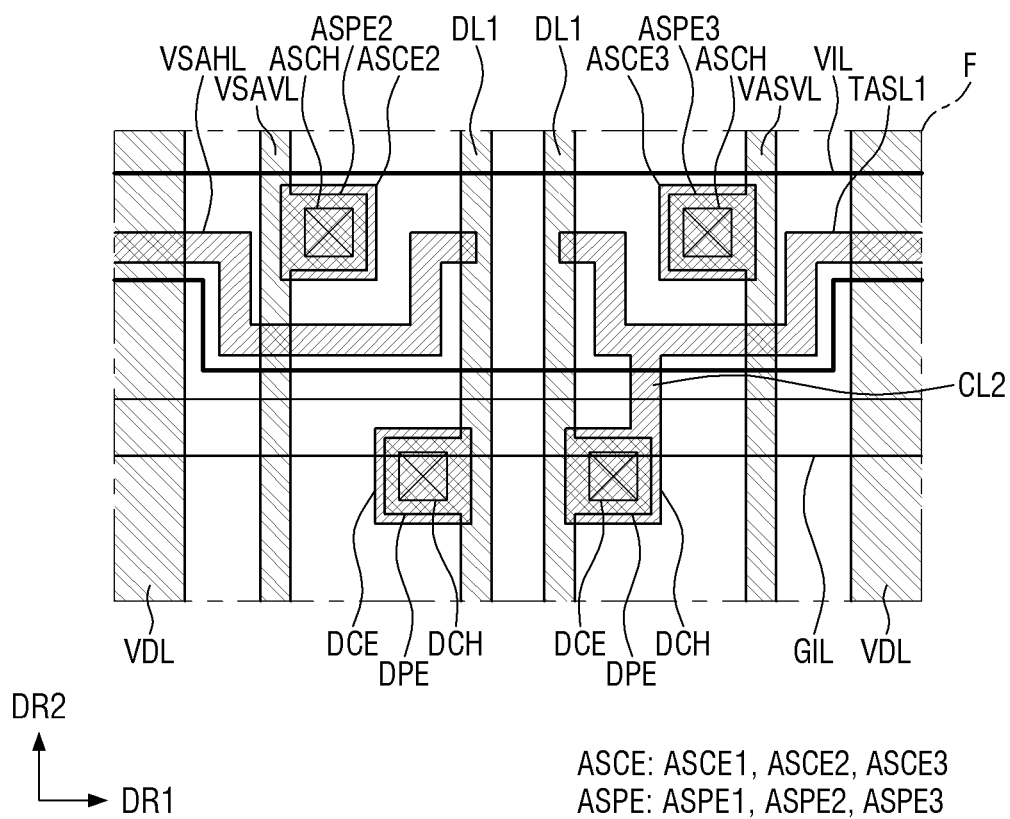

As shown in FIG. 12, the circuit layer 120 according to some embodiments further includes a second connection line CL2 connecting, among the data connection electrodes DCE, one data connection electrode DCE adjacent to the crossings (e.g., intersection) between the first data line DL1 and the first bypass auxiliary line TASL1 to the first bypass auxiliary line TASL1.

The second connection line CL2 may be disposed at the same layer as (e.g., in the same layer as) the first bypass auxiliary line TASL1 and the data connection electrode DCE, that is, in the first source-drain conductive layer, which is on the second interlayer insulating layer 126.

The second connection line CL2 may extend between the first bypass auxiliary line TASL1 and the one data connection electrode DCE.

For example, the second connection line CL2 may extend in the second direction DR2. However, this is merely an example, and the extension direction of the second connection line CL2 is not limited to that shown in FIG. 12.

The one data connection electrode DCE adjacent to the crossings (e.g., intersection) between the first data line DL1 and the first bypass auxiliary line TASL1 may be electrically connected to the first bypass auxiliary line TASL1 through the second connection line CL2.

One data protrusion electrode DPE overlapping the one data connection electrode DCE that is adjacent to the crossing (e.g., the intersection) between the first data line DL1 and the first bypass auxiliary line TASL1 may protrude in the first direction DR1 from the first data line DR1.

The one data protrusion electrode DPE may be electrically connected to the one data connection electrode DCE through the data connection hole DCH.

Accordingly, the first data line DL1 may be electrically connected to the first bypass auxiliary line TASL1 through the one data protrusion electrode DPE, the one data connection electrode DCE, and the second connection line CL2.

Figure 13:
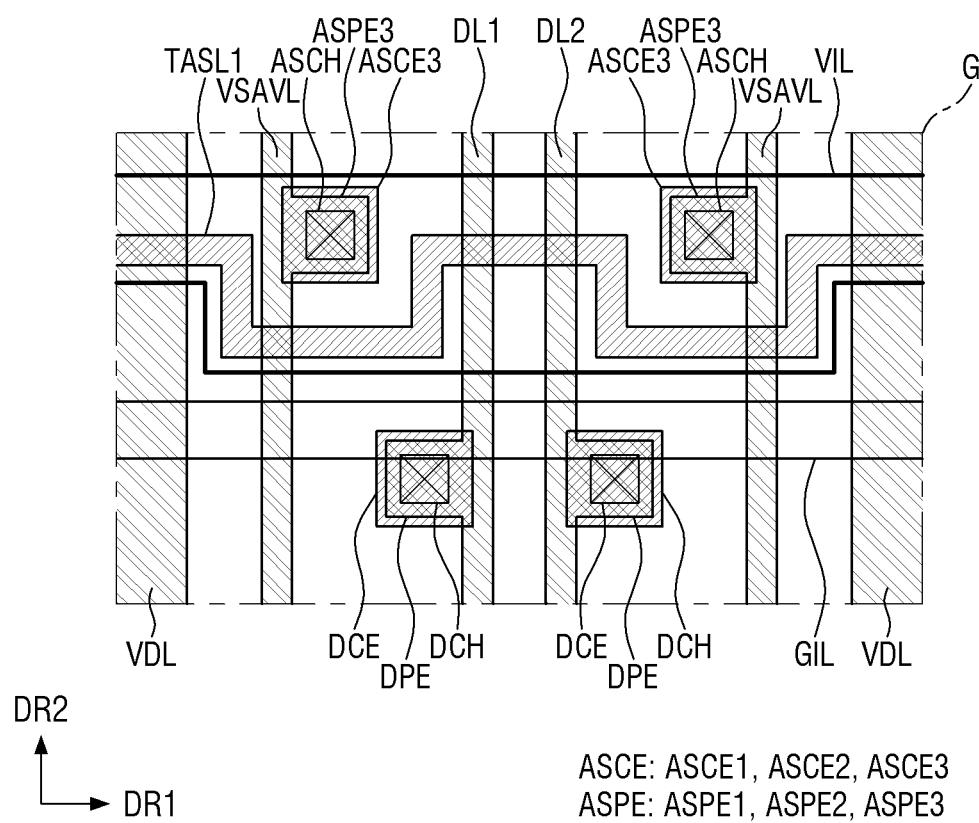
Figure 14:
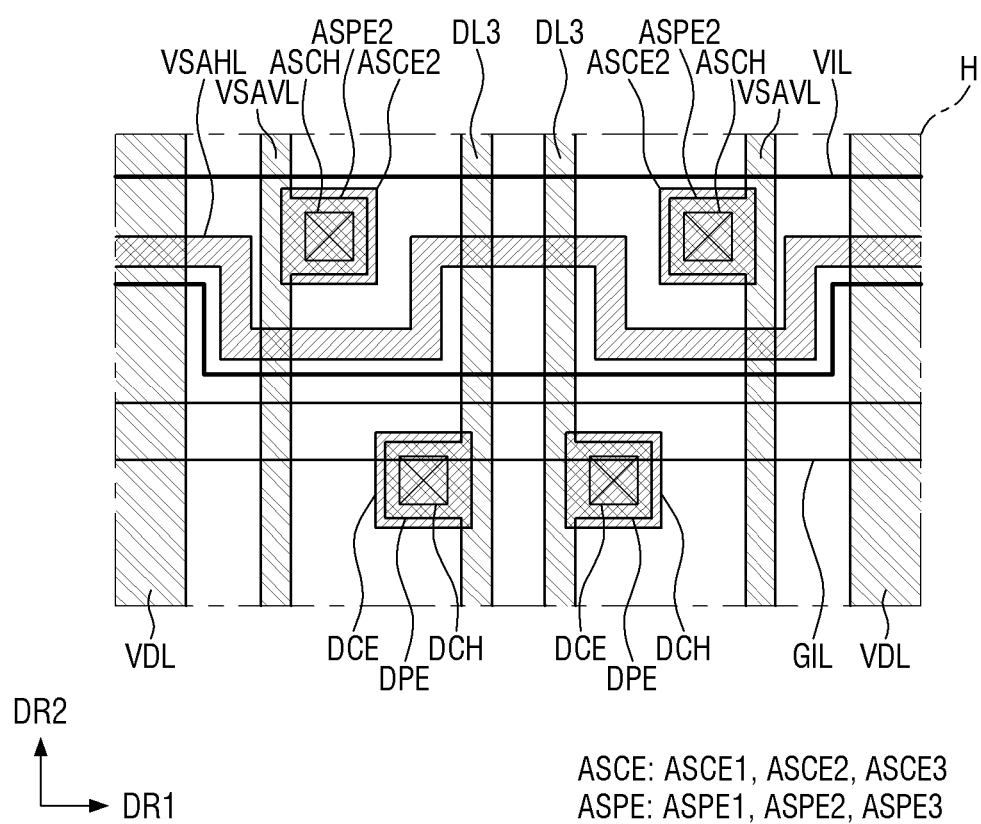

As shown in FIGS. 12 and 13, the circuit layer 120 according to some embodiments further includes third connection auxiliary electrodes ASCE3 adjacent to crossings (e.g., intersections) between the second power auxiliary vertical lines VSAVL and the first bypass auxiliary line TASL1; and third auxiliary protrusion electrodes ASPE3 protruding from the second power auxiliary vertical lines VSAVL and respectively electrically connected to the third connection auxiliary electrodes ASCE3 through the auxiliary connection holes ASCH.

The third connection auxiliary electrodes ASCE3 may be disposed at the same layer as (e.g., in the same layer as) the first bypass auxiliary line TASL1, that is, in the first source-drain conductive layer, which is on the second interlayer insulating layer 126.

The third connection auxiliary electrodes ASCE3 may face one side of the first bypass auxiliary line TASL1 in the second direction DR2.

According to some embodiments, each of the third connection auxiliary electrodes ASCE3 has an island shape (e.g., a rectangular shape) spaced apart from the first bypass auxiliary line TASL1.

Therefore, even if the third auxiliary protrusion electrode ASPE3 protruding from the second power auxiliary vertical line VSAVL is electrically connected to the third connection auxiliary electrode ASCE3 through the auxiliary connection hole ASCH, electrical connection between the first bypass auxiliary line TASL1 and the second power auxiliary vertical line VSAVL is achieved by both the third connection auxiliary electrode ASCE3 and the third auxiliary protrusion electrode ASPE3.

Further, as illustrated in FIG. 11, the circuit layer 120 according to some embodiments further includes fourth connection auxiliary electrodes ASCE4 adjacent to crossings (e.g., intersections) between the second bypass auxiliary line TASL2 and the second power auxiliary horizontal lines VSAHL; and fourth auxiliary protrusion electrodes ASPE4 protruding from the second power auxiliary horizontal lines VSAHL and respectively electrically connected to the fourth connection auxiliary electrodes ASCE4 through the auxiliary connection holes ASCH.

The fourth connection auxiliary electrodes ASCE4 may be disposed at the same layer as (e.g., in the same layer as) the second power auxiliary horizontal line VSAHL, that is, in the first source-drain conductive layer, which is on the second interlayer insulating layer 126.

The fourth connection auxiliary electrodes ASCE4 may face one side of the second power auxiliary horizontal line VSAHL in the second direction DR2.

According to some embodiments, each of the fourth connection auxiliary electrodes ASCE4 has an island shape (e.g., a rectangular shape) spaced apart from the second power auxiliary horizontal line VSAHL.

Therefore, even if the fourth auxiliary protrusion electrodes ASPE4 protruding from the second bypass auxiliary line TASL2 are electrically connected to the fourth connection auxiliary electrodes ASCE4 through the auxiliary connection holes ASCH, electrical connection between the second power auxiliary horizontal line VSAHL and the second bypass auxiliary line TASL2 is achieved by both the fourth connection auxiliary electrode ASCE4 and the fourth auxiliary protrusion electrode ASPE4.

Third connection lines CL3 (see, e.g., FIGS. 15 and 16) for electrical connection between the second power auxiliary horizontal lines VSAHL and the second power auxiliary vertical lines VSAVL may be disposed in the general area GA.

That is, in the general area GA, one of the second power auxiliary horizontal lines VSAHL may be electrically connected to at least one of the second power auxiliary vertical lines VSAVL.

Figure 15:
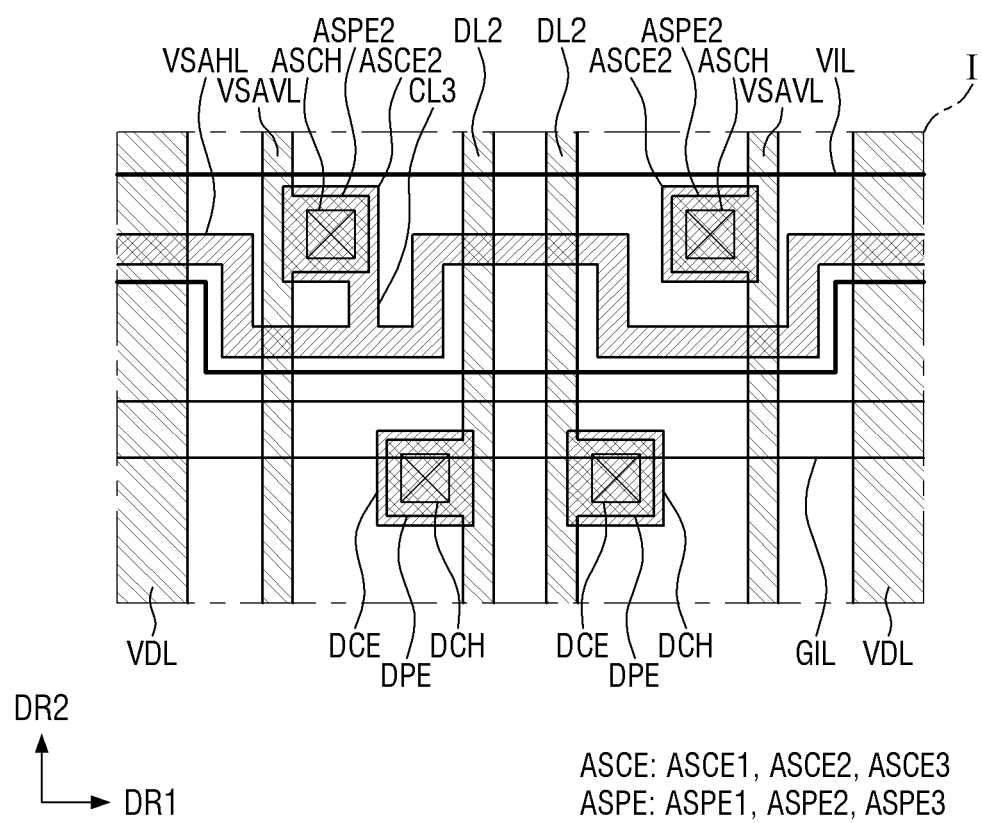
Figure 16:
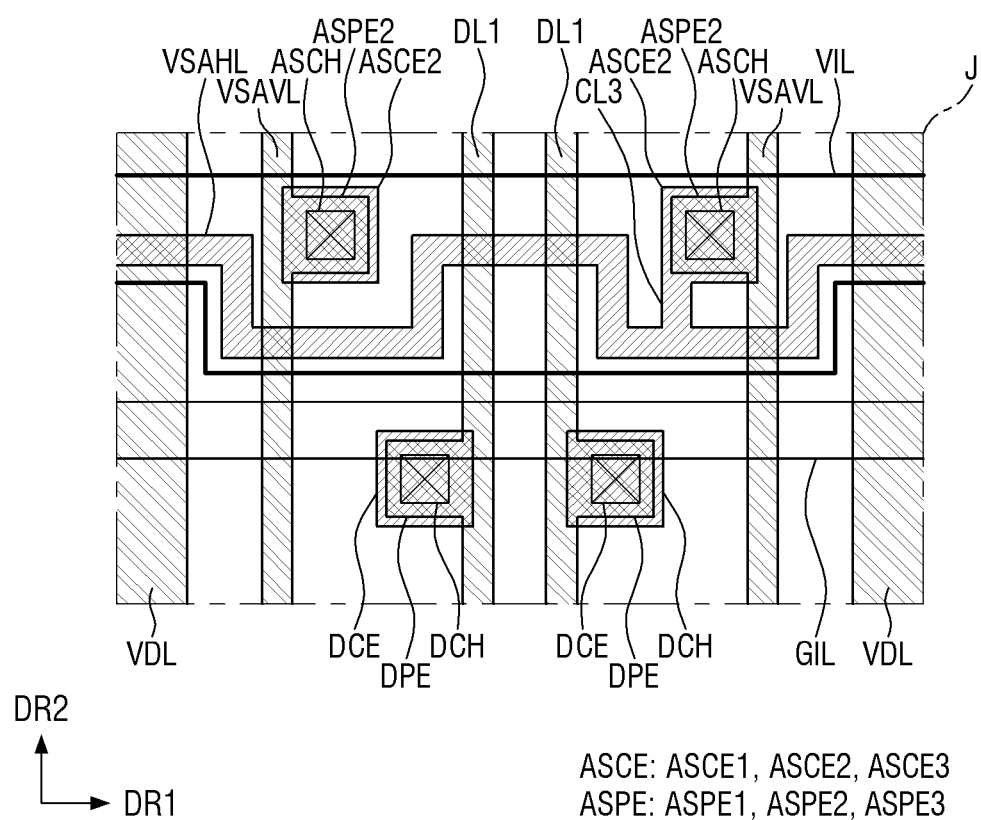

As shown in FIGS. 15 and 16, according to some embodiments, the circuit layer 120 further includes at least one third connection line CL3 connecting at least one second connection auxiliary electrode ASCE2 adjacent to a crossing (e.g., an intersection) between the one second power auxiliary horizontal line VSAHL and the at least one second power auxiliary vertical line VSAVL to the one second power auxiliary horizontal line VSAHL.

Accordingly, the at least one second power auxiliary vertical line VSAVL may be electrically connected to the one second power auxiliary horizontal line VSAHL through the at least one auxiliary protrusion electrode ASPE2 protruding from the at least one second power auxiliary vertical line VSAVL and overlapping the at least one second connection auxiliary electrode ASCE2, the at least one second connection auxiliary electrode ASCE2, and the at least one third connection line CL3.

As described above, according to some embodiments, the circuit layer 120 includes the connection auxiliary electrodes ASCE adjacent to the crossings (e.g., intersections) between the first auxiliary lines ASL1 and the second auxiliary lines ASL2 and spaced apart from the first auxiliary lines ASL1; and the auxiliary protrusion electrodes ASPE protruding from the second auxiliary lines ASL2 and respectively electrically connected to the connection auxiliary electrodes ASCE through the auxiliary connection holes ASCH.

Further, according to some embodiments, the circuit layer 120 further includes the data connection electrodes DCE adjacent to the crossings (e.g., intersections) between the data lines DL and the first auxiliary lines ASL1 and spaced apart from the first auxiliary lines ASL1 and the connection auxiliary electrodes ASCE; and the data protrusion electrodes DPE protruding from the data lines DL and respectively electrically connected to the data connection electrodes DCE through the data connection holes DCH.

The connection auxiliary electrodes ASCE may face one side of the first auxiliary lines ASL1 in the second direction DR2, and the data connection electrodes DCE may face the other side (e.g., the opposite side) of the first auxiliary lines ASL1 in the second direction DR2.

That is, the first auxiliary lines ASL1 may be disposed between the connection auxiliary electrodes ASCE and the data connection electrodes DCE.

Furthermore, because the connection auxiliary electrodes ASCE are adjacent to the second auxiliary lines ASL2 and the data connection electrodes DCE are adjacent to the data lines DL, the connection auxiliary electrodes ASCE and the data connection electrodes DCE may be spaced apart from each other in a diagonal direction crossing the first and second directions DR1 and DR2.

The connection auxiliary electrodes ASCE may include the first connection auxiliary electrode ASCE1 adjacent to the crossing (e.g., the intersection) between the second bypass auxiliary line TASL2 and the first bypass auxiliary line TASL1; the second connection auxiliary electrodes ASCE2 adjacent to the crossings (e.g., the intersections) between the second power auxiliary vertical lines VSAVL and the second power auxiliary horizontal lines VSAHL; and the third connection auxiliary electrodes ASCE3 adjacent to the crossings (e.g., the intersections) between the second power auxiliary vertical lines VSAVL and the first bypass auxiliary line TASL1.

According to some embodiments, because all of the connection auxiliary electrodes ASCE disposed in the display area DA overlap the respective auxiliary connection holes ASCH, visibility due to the arrangement of the auxiliary connection holes ASCH is greatly reduced (e.g., is entirely eliminated). Accordingly, it is possible to prevent the visibility of the end of the first bypass auxiliary line TASL1 from being increased due to the arrangement of the auxiliary connection holes ASCH.

Further, according to some embodiments, each of the connection auxiliary electrodes ASCE has an island shape (e.g., a rectangular shape) spaced apart from the first auxiliary lines ASL1. Therefore, even if all of the connection auxiliary electrodes ASCE overlap the respective auxiliary connection holes ASCH, this does not affect the electrical connection.

As illustrated in FIGS. 11, 12, 15 and 16, according to some embodiments, the circuit layer 120 further includes, for the sake of selective electrical connection, the first connection line CL1 for the electrical connection between the second bypass auxiliary line TASL2 and the first bypass auxiliary line TASL1; the second connection line CL2 for the electrical connection between the first data line DL1 and the first bypass auxiliary line TASL1; and the third connection line CL3 for the electrical connection between the second power auxiliary vertical lines VSAVL and the second power auxiliary horizontal lines VSAHL.

Figure 17:
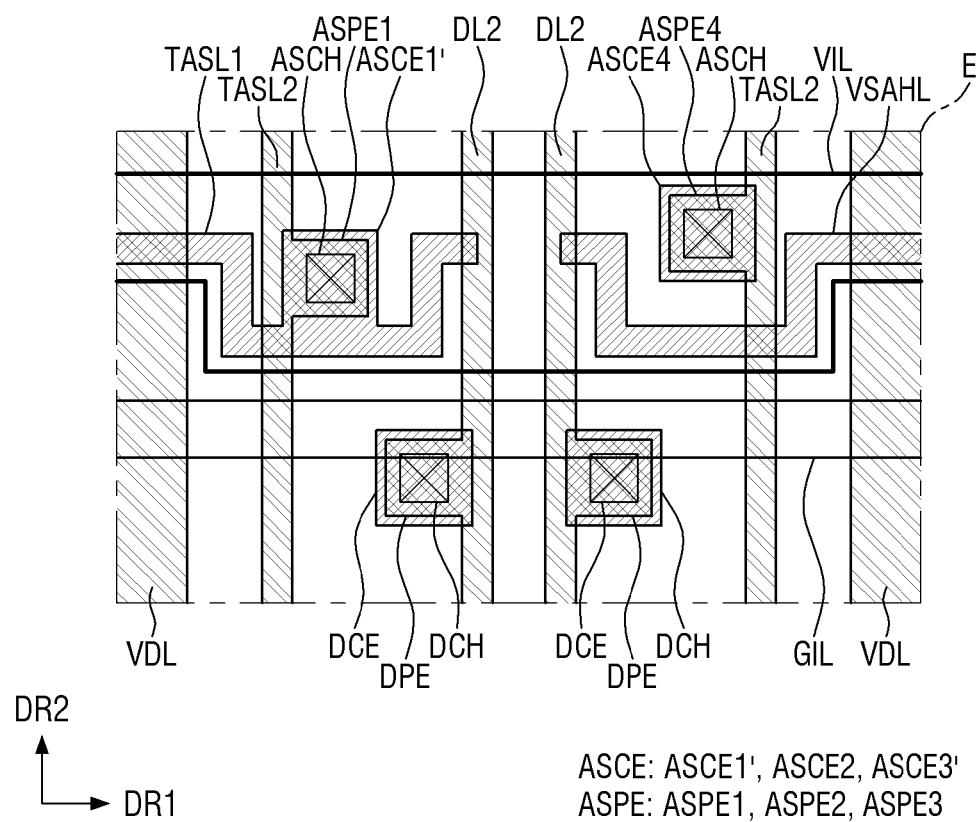
FIGS. 17 and 18 are plan views respectively illustrating the regions E and F of FIG. 8 according to some other embodiments of the present disclosure.
Figure 18:
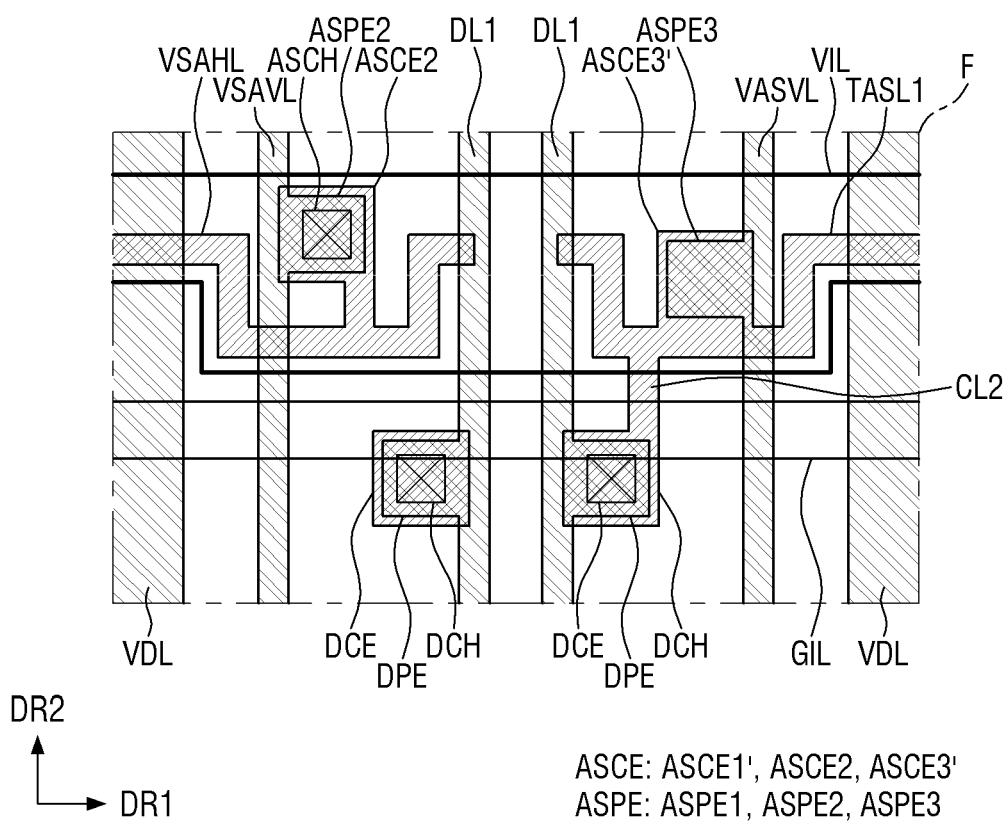

FIGS. 17 and 18 are plan views respectively illustrating the regions E and F of FIG. 8 according to some other embodiments of the present disclosure.

As illustrated in FIGS. 17 and 18, the circuit layer 120 of the display device 100 according to some other embodiments is substantially the same as that of the embodiments shown in FIGS. 11 to 16, except that a first connection auxiliary electrode ASCE1', which is adjacent to the crossing (e.g., the intersection) between the second bypass auxiliary line TASL2 and the first bypass auxiliary line TASL1, and third connection auxiliary electrodes ASCE3', which is adjacent to the crossings (e.g., the intersections) between the second power auxiliary vertical lines VSAVL and the first bypass auxiliary line TASL1, protrude from the first bypass auxiliary line TASL1, and the third connection auxiliary electrodes ASCE3' do not overlap the auxiliary connection holes ASCH. As such, redundant descriptions of the circuit layer 120 may not be repeated below.

According to some other embodiments, the first connection auxiliary electrode ASCE1' and the third connection auxiliary electrodes ASCE3' are disposed so as to protrude from the first bypass auxiliary line TASL1 in the second direction DR2. That is, because the first connection auxiliary electrode ASCE1' is formed as a part of the first bypass auxiliary line TASL1, the first connection line CL1 for electrical connection between the first connection auxiliary electrode ASCE1' and the first bypass auxiliary line TASL1 is not necessary.

In addition, because the first connection auxiliary electrode ASCE1' and the third connection auxiliary electrodes ASCE3' protrude from the first bypass auxiliary line TASL1, if the first connection auxiliary electrode ASCE1' and the third connection auxiliary electrodes ASCE3' overlap the auxiliary connection holes ASCH, selective electrical connection to the first bypass auxiliary line TASL1 is impossible. As a resolution, according to some other embodiments, by disposing the auxiliary connection hole ASCH only in the first connection auxiliary electrode ASCE1' among the first connection auxiliary electrode ASCE1' and the third connection auxiliary electrodes ASCE3', electrical connection between the first bypass auxiliary line TASL1 and the second bypass auxiliary line TASL2 is selectively implemented.

Figure 19:
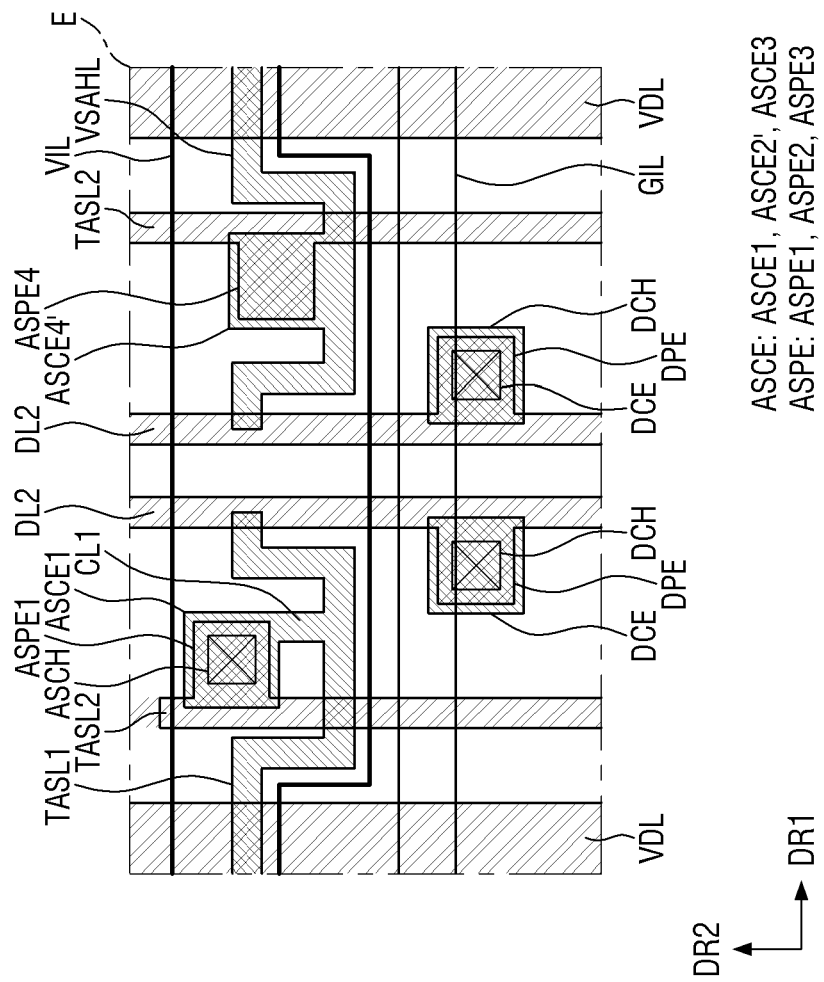
FIGS. 19, 20, and 21 are plan views respectively illustrating the regions E and F of FIG. 8 and part I of FIG. 9 according to still other embodiments of the present disclosure.
Figure 20:
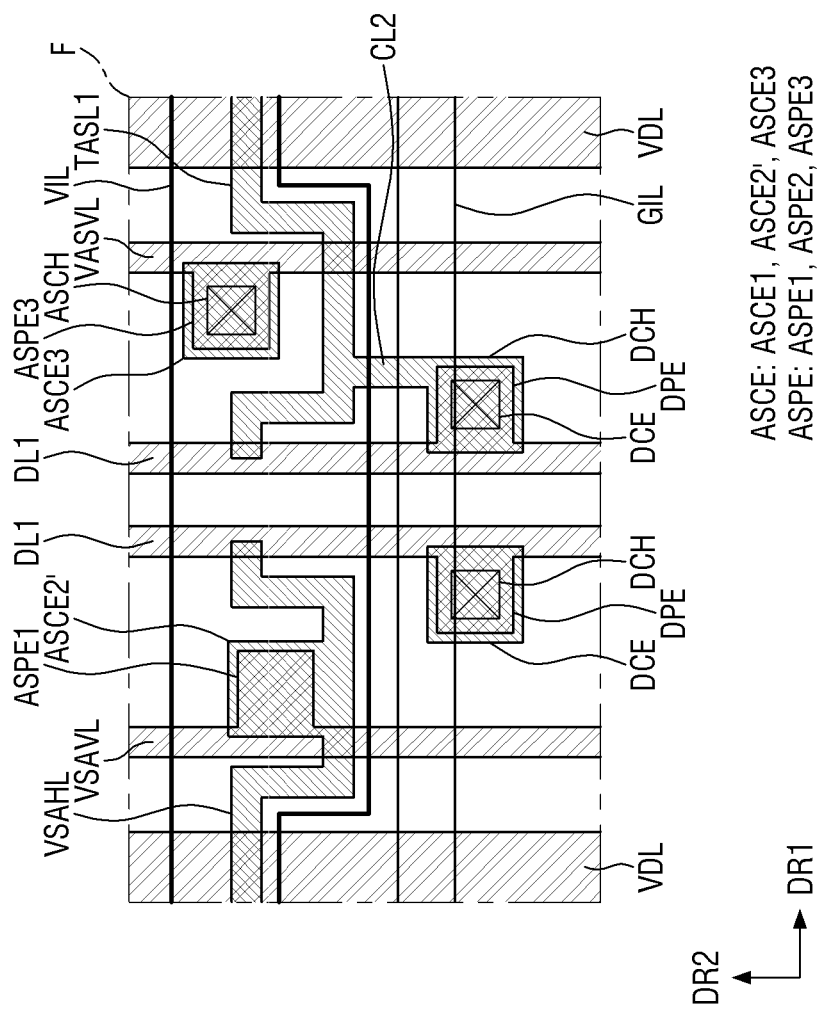
Figure 21:
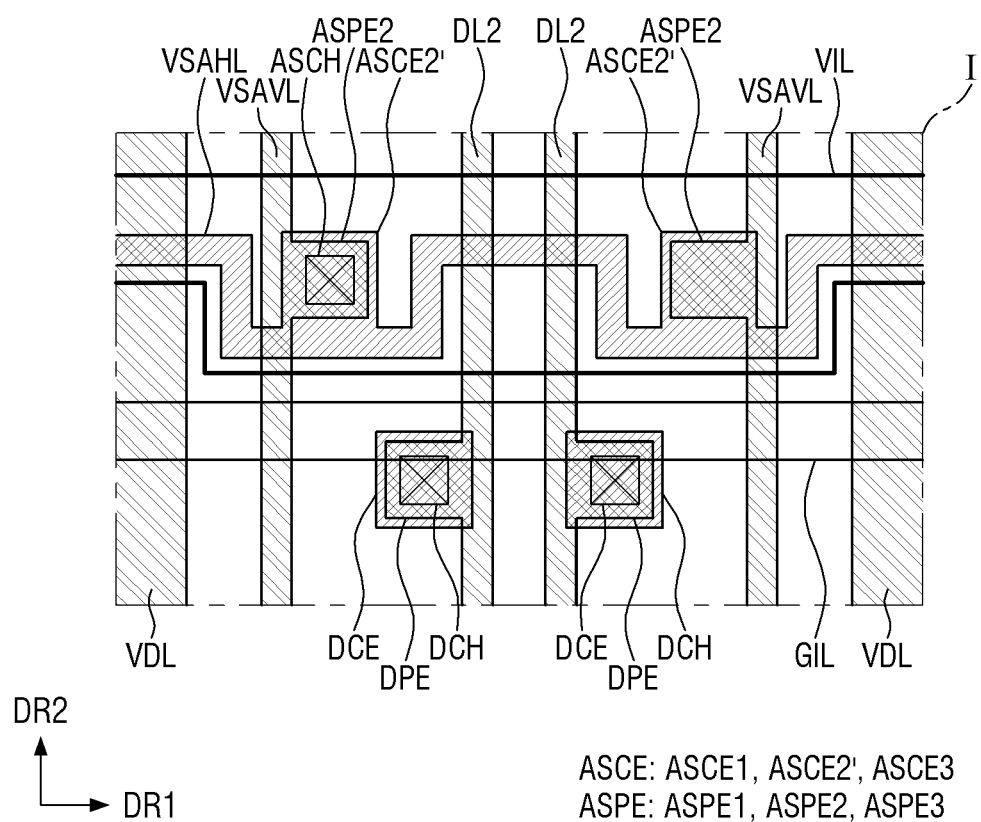

FIGS. 19, 20, and 21 are plan views respectively illustrating the regions E and F of FIG. 8 and part I of FIG. 9 according to still other embodiments of the present disclosure.

Referring to FIGS. 19, 20, and 21, the circuit layer 120 of the display device 100 according to still other embodiments is substantially the same as that of the embodiments shown in FIGS. 11 to 16, except that second connection auxiliary electrodes ASCE2', which are adjacent to the crossings (e.g., the intersections) between the second power auxiliary horizontal lines VSAHL and the second power auxiliary vertical lines VSAVL and fourth connection auxiliary electrodes ASCE4' adjacent to the crossings (e.g., the intersections) between the second power auxiliary horizontal lines VSAHL and the second bypass auxiliary lines TASL2, protrude from the second power auxiliary horizontal lines VSAHL. As such, descriptions of the circuit layer 120 may not be repeated below.

According to still other embodiments, the second connection auxiliary electrodes ASCE2' and the fourth connection auxiliary electrodes ASCE4' is disposed so as to protrude from the second power auxiliary horizontal line VSAHL in the second direction DR2. That is, because the second connection auxiliary electrodes ASCE2' and the fourth connection auxiliary electrodes ASCE4' are formed as a part of the second power auxiliary horizontal line VSAHL, the third connection line CL3 for electrical connection between the second power auxiliary horizontal line VSAHL and the second power auxiliary vertical line VSAVL may be omitted (e.g., is not necessary). Further, because the second connection auxiliary electrodes ASCE2' and the fourth connection auxiliary electrodes ASCE4' protrude from the second power auxiliary horizontal line VSAHL, if the second connection auxiliary electrodes ASCE2' and the fourth connection auxiliary electrodes ASCE4' overlap the auxiliary connection holes ASCH, selective electrical connection to the second power auxiliary horizontal line VSAHL is not possible.

As a resolution, according to still other embodiments, by disposing the auxiliary connection holes ASCH only in some of the second connection auxiliary electrodes ASCE2' among the second connection auxiliary electrodes ASCE2' and the fourth connection auxiliary electrodes ASCE4', electrical connection between the second power auxiliary horizontal line VSAHL and the second power auxiliary vertical line VSAVL is selectively implemented. For example, some of the second connection auxiliary electrodes ASCE2' overlapping the auxiliary connection holes ASCH may be disposed in the general area GA.

It should be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and equivalents thereof.

What is claimed is:

1. A display device comprising:
a substrate comprising a display area in which emission areas are arranged, and a non-display area located around the display area;
a circuit layer on the substrate; and
an element layer on the circuit layer, and comprising light emitting elements positioned in the emission areas,
wherein the circuit layer comprises:
light emitting pixel drivers electrically connected to the light emitting elements;

data lines electrically connected to the light emitting pixel drivers;

first auxiliary lines extending in a first direction crossing the data lines and positioned in the light emitting pixel drivers; and second auxiliary lines extending in a second direction crossing the first direction and in parallel with the data lines, the second auxiliary lines being paired with respective ones of the data lines, wherein the first auxiliary lines comprise a first bypass auxiliary line electrically connected to a first data line of the data lines that is adjacent to the non-display area in the first direction, wherein the second auxiliary lines comprise a second bypass auxiliary line paired with a second data line spaced farther from the non-display area than the first data line in the first direction among the data lines, wherein the circuit layer further comprises:
  a first connection auxiliary electrode adjacent to a crossing between the first bypass auxiliary line and the second bypass auxiliary line, and spaced apart from the first bypass auxiliary line;
  a first connection line connecting the first bypass auxiliary line to the first connection auxiliary electrode; and
  a first auxiliary protrusion electrode protruding from the second bypass auxiliary line, and electrically connected to the first connection auxiliary electrode through an auxiliary connection hole of auxiliary connection holes.

2. The display device of claim 1, wherein the circuit layer further comprises:
  data connection electrodes adjacent to crossings between the data lines and the first auxiliary lines, and spaced apart from the first auxiliary lines; and
  data protrusion electrodes protruding from the data lines and electrically connected to the data connection electrodes through data connection holes.

3. The display device of claim 2, wherein the circuit layer further comprises a second connection line connecting one of the data connection electrodes that is adjacent to a crossing between the first data line and the first bypass auxiliary line to the first bypass auxiliary line.

4. The display device of claim 3, wherein the circuit layer further comprises:
  a first power supply line and a second power supply line in the non-display area, and respectively transmitting a first power and a second power for driving the light emitting elements; and
  first power lines electrically connected between the light emitting pixel drivers and the first power supply line,
  wherein the first auxiliary lines further comprise second power auxiliary horizontal lines electrically connected to the second power supply line, and
  wherein the second auxiliary lines further comprise second power auxiliary vertical lines electrically connected to the second power auxiliary horizontal lines and the second power supply line.

5. The display device of claim 4, wherein the circuit layer further comprises:
  second connection auxiliary electrodes adjacent to crossings between the second power auxiliary vertical lines and the second power auxiliary horizontal lines; and
  second auxiliary protrusion electrodes protruding from the second power auxiliary vertical lines and electrically connected to the second connection auxiliary electrodes through the auxiliary connection holes.

6. The display device of claim 5, wherein one of the second power auxiliary horizontal lines is electrically connected to at least one of the second power auxiliary vertical lines, and
  wherein the circuit layer further comprises at least one third connection line connecting at least one of the second connection auxiliary electrodes that is adjacent to a crossing between the one of the second power auxiliary horizontal lines and the at least one of the second power auxiliary vertical lines to the one of the second power auxiliary horizontal lines.

7. The display device of claim 4, wherein the circuit layer further comprises:
  third connection auxiliary electrodes adjacent to crossings between the second power auxiliary vertical lines and the first bypass auxiliary line;
  third auxiliary protrusion electrodes protruding from the second power auxiliary vertical lines, and electrically connected to the third connection auxiliary electrodes through the auxiliary connection holes;
  fourth connection auxiliary electrodes adjacent to crossings between the second bypass auxiliary line and the second power auxiliary horizontal lines; and
  fourth auxiliary protrusion electrodes protruding from the second bypass auxiliary line, and electrically connected to the fourth connection auxiliary electrodes through the auxiliary connection holes.

8. The display device of claim 4, further comprising a display driving circuit configured to transmit data signals of the light emitting pixel drivers to the data lines,
  wherein the circuit layer further comprises data supply lines in the non-display area, and electrically connected between the data lines and the display driving circuit,
  wherein a bypass area on one side of the display area comprises a central bypass middle area, a first bypass side area parallel to the central bypass middle area in the first direction and in contact with the non-display area, and a second bypass side area between the central bypass middle area and the first bypass side area,
  wherein the first data line is in the first bypass side area,
  wherein the second data line is in the second bypass side area,
  wherein a first data supply line of the data supply lines that transmits a data signal of the first data line is electrically connected to the first data line through the first bypass auxiliary line and the second bypass auxiliary line, and
  wherein a second data supply line of the data supply lines that transmits a data signal of the second data line is directly electrically connected to the second data line.

9. The display device of claim 4, wherein one of the light emitting elements is electrically connected between one of the light emitting pixel drivers and the second power supply line, and
  wherein the one of the light emitting pixel drivers comprises:
    a first transistor configured to generate a driving current for driving the one of the light emitting elements;
    a second transistor electrically connected between one of the data lines and a first electrode of the first transistor;
    a third transistor electrically connected between a gate electrode of the first transistor and a second electrode of the first transistor;

a fourth transistor electrically connected between the gate electrode of the first transistor and a first initialization power line configured to transmit a first initialization power;

a fifth transistor electrically connected between the first power lines and the first electrode of the first transistor;

a sixth transistor electrically connected between the second electrode of the first transistor and the one of the light emitting elements;

a seventh transistor electrically connected between the one of the light emitting elements and a second initialization power line configured to transmit a second initialization power; and an eighth transistor electrically connected between the first electrode of the first transistor and a bias power line configured to transmit a bias power.

10. The display device of claim 9, wherein the circuit layer comprises:

a buffer layer covering a light blocking layer on the substrate;
a first semiconductor layer on the buffer layer;
a first gate insulating layer covering the first semiconductor layer;
a first gate conductive layer on the first gate insulating layer;
a second gate insulating layer covering the first gate conductive layer;
a second gate conductive layer on the second gate insulating layer;
a first interlayer insulating layer covering the second gate conductive layer;
a second semiconductor layer on the first interlayer insulating layer;
a third gate insulating layer covering the second semiconductor layer;
a third gate conductive layer on the third gate insulating layer;
a second interlayer insulating layer covering the third gate conductive layer;
a first source-drain conductive layer on the second interlayer insulating layer;
a first planarization layer covering the first source-drain conductive layer;
a second source-drain conductive layer on the first planarization layer; and
a second planarization layer covering the second source-drain conductive layer, wherein a channel portion, a source portion, and a drain portion of each of the first transistor, the second transistor, the fifth transistor, the sixth transistor, the seventh transistor, and the eighth transistor are on the first semiconductor layer, and wherein a channel portion, a source portion, and a drain portion of each of the third transistor and the fourth transistor are as a part of the second semiconductor layer.

11. The display device of claim 10, wherein a gate electrode of the fourth transistor is electrically connected to a scan initialization line configured to transmit a scan initialization signal, wherein the first initialization power line is spaced apart from the scan initialization line and as another part of the second semiconductor layer, wherein the scan initialization line is on the third gate conductive layer, wherein the first auxiliary lines, the connection auxiliary electrodes, and the data connection electrodes are on the first source-drain conductive layer, wherein the data lines, the second auxiliary lines, the auxiliary protrusion electrodes, the data protrusion electrodes, and the first power lines are on the second source-drain conductive layer, wherein each of the auxiliary connection holes and the data connection holes penetrates the first planarization layer, and wherein the first auxiliary lines and the connection auxiliary electrodes overlap the first initialization power line and are spaced apart from the scan initialization line.

12. A display device comprising:
a substrate comprising a display area in which emission areas are arranged, and a non-display area around the display area;
a circuit layer on the substrate; and
an element layer on the circuit layer, and comprising light emitting elements positioned in the emission areas,
wherein the circuit layer comprises:
light emitting pixel drivers electrically connected to the light emitting elements;
data lines electrically connected to the light emitting pixel drivers;
first auxiliary lines extending in a first direction crossing the data lines and positioned in the light emitting pixel drivers;
second auxiliary lines extending in a second direction crossing the first direction and in parallel with the data lines, the second auxiliary lines being paired with respective ones of the data lines;
connection auxiliary electrodes adjacent to crossings between the first auxiliary lines and the second auxiliary lines and spaced apart from the first auxiliary lines; and
auxiliary protrusion electrodes protruding from the second auxiliary lines, and electrically connected to the connection auxiliary electrodes through an auxiliary connection hole of auxiliary connection holes.

13. The display device of claim 12, wherein the circuit layer further comprises:
data connection electrodes adjacent to crossings between the data lines and the first auxiliary lines, and spaced apart from the first auxiliary lines and the connection auxiliary electrodes; and
data protrusion electrodes protruding from the data lines and respectively electrically connected to the data connection electrodes through data connection holes.

14. The display device of claim 13, wherein the connection auxiliary electrodes face one side of the first auxiliary lines in the second direction,
wherein the data connection electrodes face an other side of the first auxiliary lines in the second direction, and
wherein the connection auxiliary electrodes and the data connection electrodes are spaced apart from each other in a diagonal direction crossing the first direction and the second direction.

15. The display device of claim 13, further comprising a display driving circuit configured to transmit data signals of the light emitting pixel drivers to the data lines,
wherein the circuit layer further comprises data supply lines in the non-display area, and electrically connected between the data lines and the display driving circuit,
wherein a bypass area on one side of the display area comprises a central bypass middle area, a first bypass side area parallel to the central bypass middle area in the first direction and in contact with the non-display area, and a second bypass side area between the central bypass middle area and the first bypass side area, wherein the data lines comprise a first data line in the first bypass side area and a second data line in the second bypass side area, wherein the first auxiliary lines comprise a first bypass auxiliary line electrically connected to the first data line, wherein the second auxiliary lines comprise a second bypass auxiliary line paired with the second data line and electrically connected to the first bypass auxiliary line, wherein a first data supply line of the data supply lines that transmits a data signal of the first data line is electrically connected to the first data line through the first bypass auxiliary line and the second bypass auxiliary line, and wherein a second data supply line of the data supply lines that transmits a data signal of the second data line is directly electrically connected to the second data line.

16. The display device of claim 15, wherein the circuit layer further comprises:
a first connection line connecting a first connection auxiliary electrode of the connection auxiliary electrodes that is adjacent to a crossing between the first bypass auxiliary line and the second bypass auxiliary line to the first bypass auxiliary line; and
a second connection line connecting one of the data connection electrodes that is adjacent to a crossing between the first bypass auxiliary line and the first data line to the first bypass auxiliary line,
wherein the second bypass auxiliary line is electrically connected to the first bypass auxiliary line through one of the auxiliary protrusion electrodes that overlaps the one of the connection auxiliary electrodes, the one of the connection auxiliary electrodes, and the first connection line, and
wherein the first data line is electrically connected to the first bypass auxiliary line through one of the data protrusion electrodes that overlaps the one of the data connection electrodes, the one of the data connection electrodes, and the second connection line.

17. The display device of claim 16, wherein the circuit layer further comprises:
a first power supply line and a second power supply line in the non-display area, and respectively transmitting a first power and a second power for driving the light emitting elements; and
first power lines electrically connected between the light emitting pixel drivers and the first power supply line,
wherein one of the light emitting elements is electrically connected between one of the light emitting pixel drivers and the second power, and
wherein the one of the light emitting pixel drivers comprises:
a first transistor configured to generate a driving current for driving the one of the light emitting elements;
a second transistor electrically connected between one of the data lines and a first electrode of the first transistor;
a third transistor electrically connected between a gate electrode of the first transistor and a second electrode of the first transistor;
a fourth transistor electrically connected between the gate electrode of the first transistor and a first initialization power line configured to transmit a first initialization power;
a fifth transistor electrically connected between the first power line and the first electrode of the first transistor;
a sixth transistor electrically connected between the second electrode of the first transistor and the one of the light emitting elements;
a seventh transistor electrically connected between the one of the light emitting elements and a second initialization power line configured to transmit a second initialization power; and
an eighth transistor electrically connected between the first electrode of the first transistor and a bias power line configured to transmit a bias power and.

18. The display device of claim 17, wherein the circuit layer comprises:
a buffer layer covering a light blocking layer on the substrate;
a first semiconductor layer on the buffer layer;
a first gate insulating layer covering the first semiconductor layer;
a first gate conductive layer on the first gate insulating layer;
a second gate insulating layer covering the first gate conductive layer;
a second gate conductive layer on the second gate insulating layer;
a first interlayer insulating layer covering the second gate conductive layer;
a second semiconductor layer on the first interlayer insulating layer;
a third gate insulating layer covering the second semiconductor layer;
a third gate conductive layer on the third gate insulating layer;
a second interlayer insulating layer covering the third gate conductive layer;
a first source-drain conductive layer on the second interlayer insulating layer;
a first planarization layer covering the first source-drain conductive layer;
a second source-drain conductive layer on the first planarization layer; and
a second planarization layer covering the second source-drain conductive layer,
wherein a channel portion, a source portion, and a drain portion of each of the first transistor, the second transistor, the fifth transistor, the sixth transistor, the seventh transistor, and the eighth transistor are on the first semiconductor layer, and
wherein a channel portion, a source portion, and a drain portion of each of the third transistor and the fourth transistor are as a part of the second semiconductor layer.

19. The display device of claim 18, wherein a gate electrode of the fourth transistor is electrically connected to a scan initialization line configured to transmit a scan initialization signal,
wherein the first initialization power line is spaced apart from the scan initialization line and as another part of the second semiconductor layer,
wherein the scan initialization line is on the third gate conductive layer, wherein the first auxiliary lines, the connection auxiliary electrodes, and the data connection electrodes are on the first source-drain conductive layer, wherein the data lines, the second auxiliary lines, the auxiliary protrusion electrodes, the data protrusion electrodes, and the first power lines are on the second source-drain conductive layer, wherein each of the auxiliary connection holes and the data connection holes penetrates the first planarization layer, and wherein the first auxiliary lines and the connection auxiliary electrodes overlap the first initialization power line and are spaced apart from the scan initialization line.

20. The display device of claim 17, wherein the first auxiliary lines further comprise second power auxiliary horizontal lines electrically connected to the second power supply line, wherein the second auxiliary lines further comprise second power auxiliary vertical lines electrically connected to the second power auxiliary horizontal lines and the second power supply line, wherein one of the second power auxiliary horizontal lines is electrically connected to at least one of the second power auxiliary vertical lines, and wherein the circuit layer further comprises at least one third connection line connecting at least one connection auxiliary electrode adjacent to a crossing between the one of the second power auxiliary horizontal lines and the at least one of the second power auxiliary vertical lines to the one of the second power auxiliary horizontal lines.

* * * * *